United States Patent [19]

Castle

[11] Patent Number: 5,317,520
[45] Date of Patent: May 31, 1994

[54] COMPUTERIZED REMOTE RESISTANCE MEASUREMENT SYSTEM WITH FAULT DETECTION

[75] Inventor: Jonathan Castle, Los Angeles, Calif.

[73] Assignee: Moore Industries International Inc., Sepulveda, Calif.

[21] Appl. No.: 724,120

[22] Filed: Jul. 1, 1991

[51] Int. Cl.$^5$ .................. G01R 27/00; G01K 7/20; G01K 7/00
[52] U.S. Cl. .................. 364/482; 364/577; 374/183; 374/172
[58] Field of Search .............. 364/482, 577; 374/172, 374/183

[56] References Cited

U.S. PATENT DOCUMENTS

| | | | |
|---|---|---|---|
| 3,911,745 | 10/1975 | Erhardt | 73/341 |
| 4,102,199 | 7/1978 | Tsipouras | 73/362 |
| 4,122,719 | 10/1978 | Carlson et al. | 73/342 |
| 4,130,019 | 12/1978 | Nitschke | 73/341 |
| 4,143,550 | 3/1979 | Kobayashi | 73/362 |
| 4,201,088 | 5/1980 | Trietley, Jr. | 73/342 |
| 4,214,311 | 7/1980 | Nakashima et al. | 364/482 |
| 4,294,115 | 10/1981 | Labüs | 73/342 |
| 4,575,806 | 3/1986 | Aldrich et al. | 364/557 |
| 4,758,969 | 7/1988 | André et al. | 364/557 |
| 4,859,834 | 8/1989 | Hausler et al. | 219/497 |
| 4,890,491 | 1/1990 | Vetter et al. | 73/290 |
| 5,143,452 | 9/1992 | Maxedon et al. | 364/557 |
| 5,171,091 | 12/1992 | Krüger et al. | 374/183 |

OTHER PUBLICATIONS

Moore Industries-International, Inc., "RBT-Resistance Bulb Transmitter", catalog sheet Jul. 1987, 1 page.
Moore Industries-International, Inc., "RBX-Resistance Bulb Transmitter", catalog sheet 3.35, Sep. 1990, 1 page.
Moore Industries-International, Inc., "EP-RBX Extended Performance RTD Transmitter", catalog sheet 3.30, Jul., 1990, 1 page.
Moore Industries-International, Inc., "RIX-Isolated RTD Transmitter", catalog sheet 3.36, Sep. 1989, 1 page.

Primary Examiner—Thomas G. Black
Assistant Examiner—Tyrone V. Walker
Attorney, Agent, or Firm—Welsh & Katz, Ltd.

[57] ABSTRACT

A microprocessor-controlled remote resistance measurement system is disclosed wherein the connection leads to the three- or four-wire resistance temperature devices (RTDs) are multiplexed via a four-channel analog multiplexer at the input of the unit. A separate two-channel multiplexer is also used to multiplex a fifth input for measurement of a reference resistor. The output of the multiplexer is coupled to a voltage-to-frequency converter, wherein the frequency output is utilized as an input to the microprocessor-based controller. The microcontroller can check for broken wires by addressing the multiplexers to individually isolate any of the connecting wires to the remote RTD sensors. The output of the multiplexer is monitored in a Test Mode by connecting a known impedance to the multiplexer output to determine if any RTD connections are defective. If one of the voltage sensing wires is faulty, the known impedance will cause an erroneous frequency reading into the microcontroller, which will then provide an indication on the display for determining exactly which RTD wire is broken. Only two address lines are used to control the five multiplexer channels through the use of a function selector circuit and a two-stage measurement cycle.

1 Claim, 13 Drawing Sheets

COMPUTERIZED REMOTE RESISTANCE MEASUREMENT SYSTEM WITH FAULT DETECTION

FIELD OF THE INVENTION

The present invention generally relates to the field of remote condition-sensing equipment, for example, two-wire remote temperature-sensing transmitters. More particularity, the present invention is directed toward the problem of detecting a broken wire in a three- or four-wire resistance temperature device (RTD) temperature measuring unit.

BACKGROUND OF THE INVENTION

Two-wire transmitters are commonly used to monitor various conditions at remote locations. For example, to measure the liquid level in a tank at a remote processing plant from its central control room, a two-wire transmitter at the remote location is typically connected in series with a power supply and a load at a central location through two transmission wires. As the condition being monitored by the transmitter varies, the effective series resistance across the transmitter also varies so as to produce a corresponding change in the current drawn by the transmitter. An industry standard has developed in a large number of applications, wherein the current through the two-wire transmitter loop varies from 4–20 milliamperes (mA), wherein 4 mA is the minimum amount of current required to power the remote transmitter.

Volume, pressure, liquid level, and temperature are just some of the conditions which are typically monitored using two-wire transmitters. Temperature, however, is one of the conditions which often must be measured with precision. It is well known to utilize a resistance temperature device (RTD) for this purpose. The RTD is typically immersed in the medium, the temperature of which is to be measured, such that the resistance of the RTD will vary with the temperature changes of the medium. Utilizing either a table of resistance-temperature values or a polynomial equation to represent the relationship between the RTD's resistance and temperature, the actual temperature is then calculated from the measured resistance value of the RTD.

If the RTD is connected to the two-wire transmitter via two wire leads, then the RTD resistance measurement would necessarily include the resistance of the wire leads. For more accurate temperature measurements, a four-wire RTD system is often employed, i.e., two wires from each terminal of the RTD are connected to the two-wire transmitter. Two of the wires are used to pass current through the RTD, and the other two wires are used to sense the voltage developed across the RTD during the measurement. In this manner, the RTD's resistance is measured without passing current through the same wires that sense the voltages, i.e., without including the voltage drop of the lead wires. In still another version of an RTD system, a three-wire RTD is used, wherein such lead-length compensation is performed by measuring the voltage difference between only one voltage sensing lead and the current return lead. Numerous other RTD configurations are also possible, a few of which will be described below.

A problem often occurs whenever one of the wires to the RTD breaks or has an intermittent connection. Although a broken wire in the RTD's current path wires would immediately be apparent at the two-wire transmitter as an over-ranging, i.e., infinite, resistance measurement, a break in the voltage sensing wires may only slightly affect the resistance measurement by the amount of lead-length compensation being performed. In other words, depending upon the condition sensor configuration and the particular lead wire that is broken, a remote measurement system may appear to be functional yet be providing inaccurate readings for quite some time before the broken wire is discovered.

A need, therefore, exists for an improved remote measurement system which addresses the problem of detecting a broken wire in a three- or four-wire RTD temperature measuring unit.

OBJECTS AND SUMMARY OF THE INVENTION

Accordingly, it is a general object of the present invention to provide an improved remote resistance measurement system which is particularly adapted for determining whether a fault exists in the system.

Another object of the present invention is to provide a computerized remote resistance measuring circuit having multiplexed inputs which can individually isolate any of the connecting wires to the remote RTD sensors.

A further object of the present invention is to provide a microprocessor-controlled two-wire transmitter having the capability to determine if an intermittent exists at the transmitter input terminals, and indicate to the user precisely which terminal has the intermittent.

These and other objects are achieved by the present invention, which, briefly described, is a sensing circuit for a condition sensor having at least three sensor connection wires, the sensing circuit comprising: a multiplexer circuit having at least three input terminals for connection to the three sensor wires, at least one output port, and at least two address lines; a current source for applying power to the condition sensor; a first circuit for determining an electrical characteristic of the condition sensor as measured at the multiplexer circuit output port; and a second circuit for controlling the address lines, for determining if any connection from the condition sensor via the three sensor wires is defective and thereby providing a fault signal, and for providing an indication in response to the fault signal. In the preferred embodiment, the indication includes a message on a visual display informing the user as to which input terminal has the faulty connection.

According to the preferred embodiment, a microprocessor-controlled remote resistance measurement system is provided wherein the connection leads to the three- or four-wire resistance temperature devices are multiplexed via a four-channel analog multiplexer at the input of the unit. A separate two-channel multiplexer is also used to multiplex a fifth input for a reference resistor. The output of the multiplexer is coupled to a voltage-to-frequency converter, wherein the frequency output is utilized as an input to the microprocessor-based controller. The microcontroller can check for broken wires by addressing the multiplexers to individually isolate any of the connecting wires to the remote RTD sensors. The output of the multiplexer is monitored in a Test Mode by connecting an known impedance to the multiplexer output to determine if any RTD connections are defective. If, for example, one of the voltage sensing wires is broken, the known impedance will cause an erroneous frequency reading into the microcontroller, which will then provide an indication on the display for determining exactly which wire is broken. Only two address lines are used to control the five multiplexer channels through the use of a function selector circuit and a two-stage measurement cycle.

In addition to detecting faulty RTD connections, the multiplexer circuitry of the present invention also provides the following advantages: (1) it allows for independent measurements of a number of RTD sensors using a single two-wire transmitter; (2) it provides the capability to measure the value of one RTD independently from the value of another RTD, so that each device can be separately linearized; and (3) it provides for more accurate resistance calculations through the use of a non-grounded reference resistor at the transmitter.

BRIEF DESCRIPTION OF THE DRAWINGS

The features of the present invention which are believed to be novel are set forth with particularity in the appended claims. The invention itself, however, together with further objects and advantages thereof, may best be understood with reference to the following description when taken in conjunction with the accompanying drawings, in which:

FIG. 2b illustrates representative waveforms for the optoisolator address lines to illustrate the operation of the circuit of FIG. 2a;

FIG. 4b illustrates representative addressing waveforms for the operation of the multiplexing circuit of FIG. 4a;

FIG. 6b is a waveform timing diagram for the operation of the circuit of FIG. 5 when used with the input configuration of FIG. 6a;

FIG. 7b illustrates the timing waveforms for the four-wire sensor configuration of FIG. 7a;

FIG. 8b illustrates the timing waveforms for the three-wire RTD sensor configuration of FIG. 8a;

FIG. 9b illustrates the timing waveforms for the input configuration of FIG. 9a;

FIG. 10b illustrates the timing waveforms for the five-wire dual-sensor configuration of FIG. 10a;

FIG. 11b illustrates the timing waveforms for the three-RTD input configuration of FIG. 11a;

DETAILED DESCRIPTION OF THE INVENTION

Figure 1:
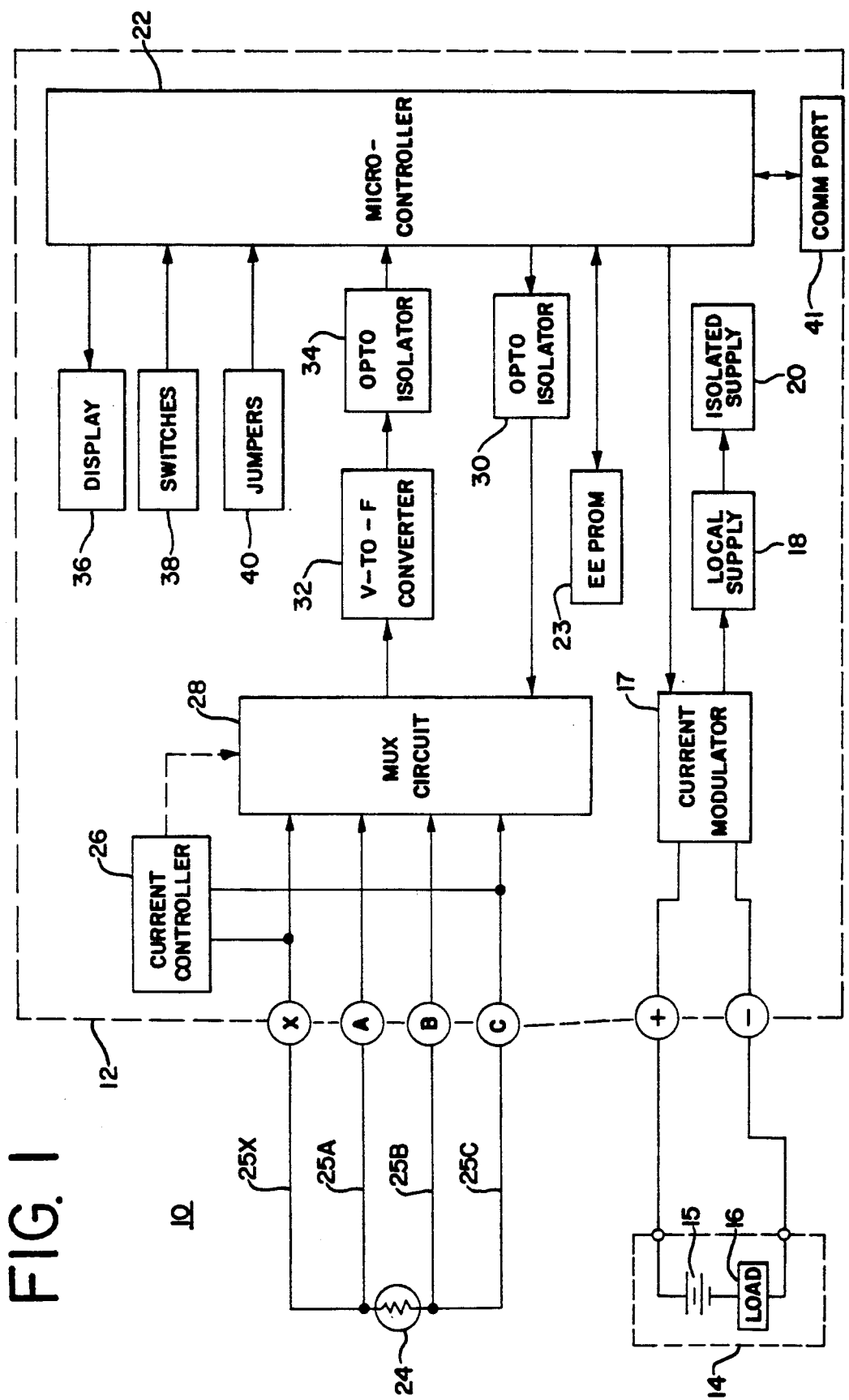
FIG. 1 is a general block diagram of the computerized remote resistance measurement system of the present invention, wherein a four-wire RTD configuration is shown.

FIG. 1 represents a general block diagram of the preferred embodiment of the present invention. The computerized remote resistance measurement system 10 of the present invention includes a two-wire transmitter 12, typically at a remote location, connected in series with a power unit 14, typically at a central location. The power unit 14 comprises a battery 15 connected in series with a load 16, both of which are connected in series with a current modulator circuit 17 in the transmitter, thus completing the two-wire current loop. The battery 15 is typically 24 volts DC, while the resistance of the load 16 varies widely depending upon the application.

In the preferred embodiment, the current modulator 17 is configured to use the industry standard of 4-20 mA, however, the former standard of 10-50 mA may also be used. On the other hand, if the transmitter unit 12 is centrally located, then the load 16 and the current modulator 17 may be omitted such that the transmitter is powered directly from the battery 15. In either case, battery power is routed to a local power supply circuit 18, from which power is routed to an isolated power supply circuit 20. The local supply 18 provides power to a microprocessor-based controller (microcontroller) 22, its associated electrically-erasable programmable read-only memory (EEPROM) 23, and the associated display circuitry, while the isolated supply 20 provides power to the remaining transmitter circuitry. The local-/isolated supply arrangement will be described in more detail in conjunction with FIG. 5.

The transmitter 12 has four input sensor connection terminals, X, A, B, and C, which are connected to an RTD 24 via connections wires 25X, 25A, 25B, and 25C, respectively, using a number of different sensor configurations as will be seen below. One such input configuration is shown in FIG. 1, wherein a single four-wire RTD 24 is connected to the transmitter 12. A current controller circuit 26 powers the RTD 24 via the current-carrying wires 25X and 25C connected to terminals X and C, while terminals A and B are connected to measure the voltage across the RTD 24 via the respective voltage sensing wires 25A and 25B. In the general block diagram of FIG. 1, current would flow from the current controller 26, out of the transmitter from terminal X, through wire 25X and the RTD 24, and would return via wire 25C to terminal C back to the current controller 26. Although the invention is adapted to use a wide variety of RTDs, i.e., having nominal resistances ranging from 10 ohms to 4000 ohms, a typical RTD used with the present invention is the widely available 100 ohm platinum bulb type RTD. Moreover, many of the principles of the present invention may also be used with other types of condition sensors which vary their capacitance, inductance, or magnetic fields in accordance with temperature, position, liquid level, dielectric constant, etc.

Each of the input terminals X, A, B, and C are also connected to the inputs of a multiplexer circuit (MUX) 28 as shown. Since the voltage sensing terminals A and B are connected to very high impedance inputs at the MUX, practically no current flows into terminals A or B during the measurement process. Hence, using the four-wire RTD configuration shown, the voltage measured across terminals A and B is the precise product of the excitation current flowing from terminals X to C, and the resistance of the RTD sensor 24. Hence, the resistance of the current-carrying wires 25X and 25C connected to terminals X and C do not enter into the resistance equation. In this manner, lead-length compensation is inherently being performed such that a much more accurate resistance measurement can be obtained.

Multiplexing control signals are provided by the microcontroller 22 to the MUX 28 via an optoisolator 30. As will be explained in detail below, the multiplexer circuit 28 provides the ability to individually select any one of the RTD connection wires 25 in order to measure, at the MUX output port, the voltage developed from each of the input terminals X, A, B, and C to a ground reference point. The output voltage signal of the MUX 28 is connected to a voltage-to-frequency (V-to-F) converter 32, which provides frequency output data to the microcontroller 22 via another optoisolator 34. A typical voltage-to-frequency converter, which could be used as V-to-F converter 32, is disclosed in the 1990 Linear Applications Handbook, published by Linear Technology, in Application Note 14, pg. 9.

Basically, the microcontroller performs the functions of frequency-to-ohms conversion, ohms-to-temperature conversion, and temperature-to-pulse-width modulation (PWM) conversion to drive the current modulator 17. The microcontroller 22 automatically switches between a Measurement Mode, wherein the resistance of the RTD is calculated and temperature information is provided to the user, and a Test Mode, wherein the microcontroller 22 directs the MUX 28 to check if any of the wires 25 to RTD 24 are broken. In the Measurement Mode, the MUX 28 provides voltage information to the V-to-F converter 32, which, in turn, provides frequency information to the microcontroller 22. This frequency information, as well as information from user-accessible mode switches 38 and a set of factory-programmed wire jumpers 40, is processed by the microcontroller 22 to provide the temperature information to the user via a visual display 36. The temperature information is also transmitted over the two-wire link via the current modulator 17. In the Test Mode, the frequency information provided to the microcontroller 22 is used in conjunction with the addressing information provided by the microcontroller 22 to the MUX 28 to check for broken wires and to inform the user of precisely which wire is broken via the display 36. A communications test port 41 may also be connected to the microcontroller 22 to allow for automated factory calibration procedures. A Motorola 68HCO5 is used as microcontroller 22 in the preferred embodiment. The EEPROM 23 is used to store calibration information used in the system.

More specifically, in accordance with the operation of the Test Mode, the microcontroller 22 directs the MUX 28 via optoisolator 30 to check whether any one of the wires 25X, 25A, 25B, and 25C is broken, such that this fault information is provided to the user via the display 36. As will be seen below, if wire 25X from the RTD 24 to terminal X is broken, or if wire 25C from the other terminal of the RTD 24 to terminal C is broken, no current will flow through the RTD. Even in the Measurement Mode of operation, this condition will immediately be noticed by the microcontroller 22 when it receives either a zero frequency value or an over-range frequency value from the optoisolator 34.

However, if one or more of the voltage sensing wires 25A or 25B from the RTD 24 to terminals A or B is broken, current will still flow through the RTD device, and a zero or over-range frequency value will not be detected in the Measurement Mode. Moreover, since the input terminal A or B would now be floating, one can not predict what the voltage level out of the MUX will be. If it remains within the approximate range of appropriate voltage sensing values, the V-to-F converter 32 may continue to output a nominal frequency value which appears to be normal. Therefore, the present invention implements the Test Mode to detect whether any of the RTD connection wires, particularly the voltage sensing wires 25A and 25B, are faulty by connecting a known impedance to the MUX output. If one of the voltage sensing wires 25A or 25B is broken, the known impedance will load down the output of the MUX such that either an over-range or zero frequency value will be present at the input to the microcontroller. Since the microcontroller 22 is also controlling the addressing to the MUX 28, the microcontroller can determine exactly which wire is broken and display this information to the user. The following description provides a detailed explanation of both the MUX circuitry involved and the software program followed to perform this fault analysis.

Figure 2A:
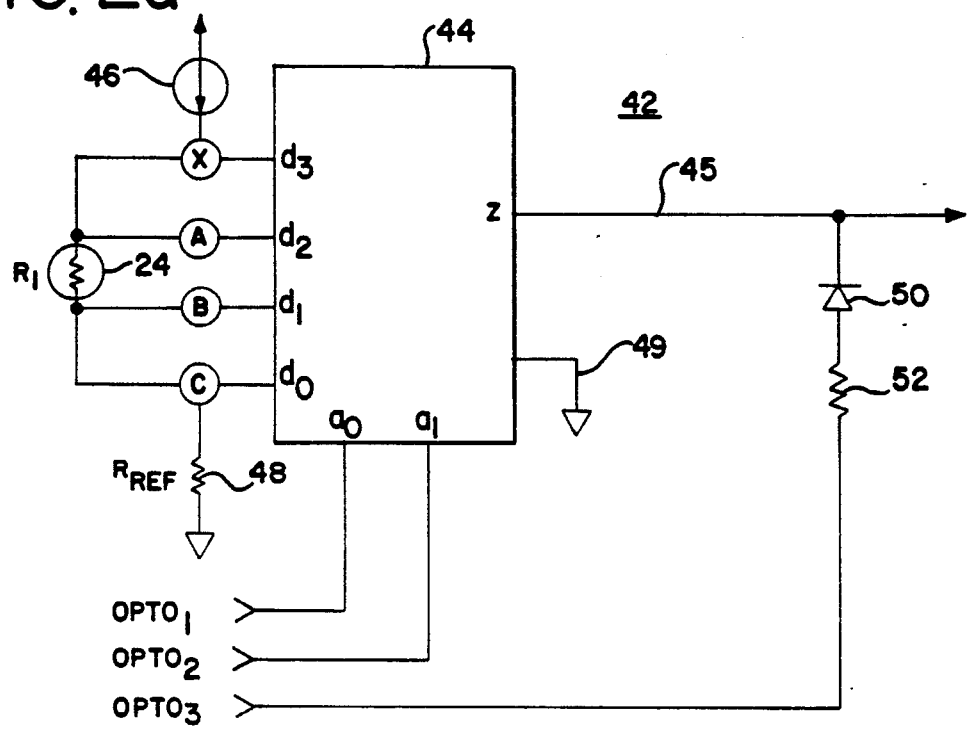
FIG. 2a is a simplified schematic diagram of the multiplexing circuit of FIG. 1, wherein three address lines are provided by the optoisolator.

FIG. 2a is a simplified schematic diagram of one embodiment of a multiplexing circuit 42 which serves as the MUX 28 of FIG. 1. The multiplexing circuit 42 includes a four-channel analog multiplexer 44, a current source 46, a reference resistor $R_{REF}$ 48, and a known impedance 52 switchably connected to the output Z of the multiplexer 44 through a diode 50. In this embodiment, three address lines, $OPTO_1$, $OPTO_2$, and $OPTO_3$, are provided to the multiplexing circuit 42 from the microcontroller 22 via the optoisolator 30. As explained below, the microcontroller 22 controls these address lines such that the multiplexing circuit 42 connects any one of the four input terminals X, A, B, or C to the multiplexer output port Z, with and without switching in the known impedance 52.

As can be seen from FIG. 2a, the current controller 26 of FIG. 1 basically comprises a constant current source 46 and a reference resistor 48, labeled $R_{REF}$. The reference resistor $R_{REF}$ is used to precisely determine the value of the current flowing through the RTD sensor 24, labeled $R_1$. Since the same current flows through the reference resistor 48 as through the RTD 24, the current I through the RTD sensor $R_1$ is:

$$I = V_{R1}/R_1 = V_{REF}/R_{REF} \tag{1}$$

where $V_{R1}$ is the voltage drop across $R_1$, and $V_{REF}$ is the voltage drop across $R_{REF}$. In the four-wire RTD configuration shown, the voltage drop across $R_1$ is equal to the voltage measured at terminal A to ground minus the voltage measured at terminal B to ground, i.e., $V_{R1} = V_A - V_B$. Similarly, the voltage drop across $R_{REF}$ is equal to the voltage measured at terminal C to ground, i.e., $V_{REF} = V_C$. Hence, $$R_1 = V_{R1}/I = V_{R1}/(V_{REF}/R_{REF}), \text{ or} \tag{2}$$

$$R_1 = (V_A - V_B)/(V_C/R_{REF}), \text{ and finally} \tag{3}$$

$$R_1 = [(V_A - V_B)/V_C]R_{REF}. \tag{4}$$

If a two-wire RTD sensor were used such that there were no connection wires from $R_1$ to terminals A or B, then $$R_1 = [(V_X - V_C)/V_C]R_{REF}, \tag{5}$$

although no lead-length compensation would be performed. In other words, using a two-wire RTD sensor, the sensor resistance is proportional to $V_X - V_C$. When using a four-wire sensor, the sensor resistance is proportional to $V_A - V_B$. If a three-wire RTD configuration were used, wherein no connection wire exists from $R_1$ to terminal B, the RTD sensor resistance would be proportional to $V_A - V_C$, and a different calculation would be performed to compensate for lead length. In any case, note that the excitation current I provided by the current source 46 is no longer part of the resistance equation, since the final resistance equation is a function of ratios of voltage values. As will be explained below, the microcontroller 22 utilizes these proportional voltage values to calculate the resistance of the RTD sensor 24 in the Measurement Mode. In the Test Mode, the known impedance 52 is switched in, such that the measured value of the RTD sensor is now being affected by the resistance of the known impedance connected in parallel.

Figure 2B:
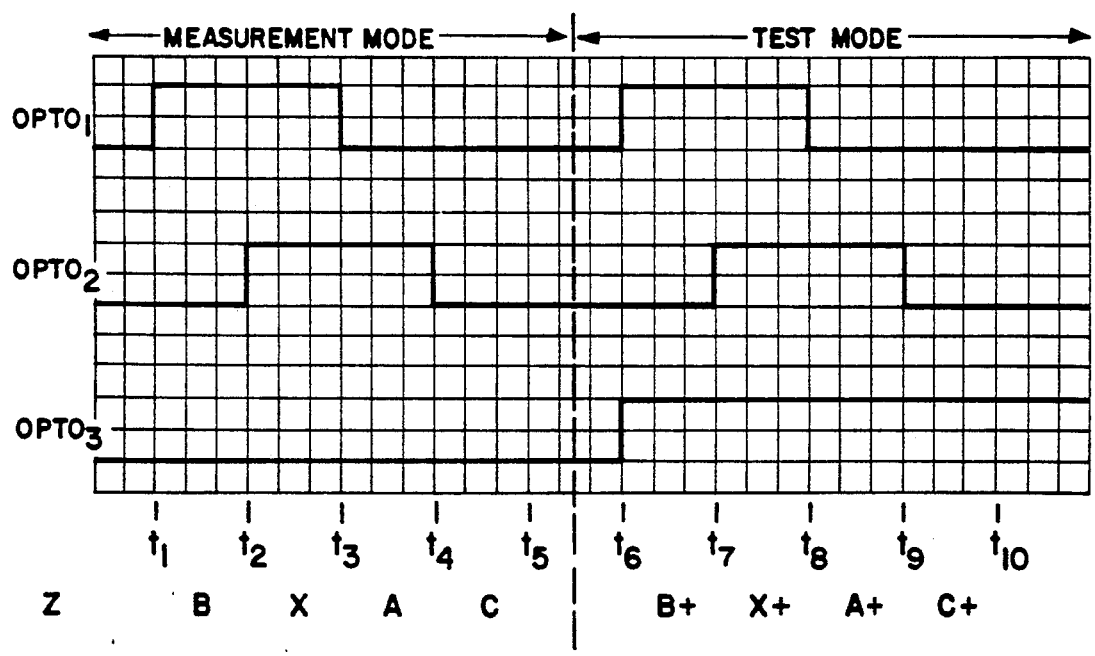

FIG. 2b illustrates representative waveforms for the address lines $OPTO_1$, $OPTO_2$, and $OPTO_3$ from the optoisolator 30. Using these waveforms, the operation of the multiplexing circuitry 42 of FIG. 2a will now be described. As illustrated in the waveform diagram, a complete measurement cycle is comprised of a Measurement Mode and a Test Mode. During the Measurement Mode, the multiplexer address line $OPTO_3$ always remains low, while it remains high through much of the Test Mode. With a low voltage from $OPTO_3$ applied to the resistor 52, the diode 50 is reversed biased, such that the known impedance has no effect on the measurement of the output voltage at Z.

At time $t_1$, the microcontroller 22 places a high voltage level on address line $OPTO_1$, while $OPTO_2$ and $OPTO_3$ remain low. Since $OPTO_1$ is connected to multiplexer address port $a_0$, and since $OPTO_2$ is connected to address port $a_1$, a binary '01' is applied to the multiplexer 44 such that multiplexer data port $d_1$ is connected to the output port Z. Hence, at this time, the voltage level at the output port Z of the multiplexer 44 represents the voltage level apparent at input terminal B as measured from ground. This is shown as $Z = B$ at the bottom of FIG. 2b during the time interval $t_1$-$t_2$. At time $t_2$, the address line $OPTO_2$ goes high, such that a binary '11' is applied to the multiplexer 44. Accordingly, the multiplexer selects its data port $d_3$ such that the voltage level at output port Z is equal to that of the input terminal X, i.e., $Z = X$. At time $t_3$, a binary '10' is used to address multiplexer data port $d_2$, such that $Z = A$. Finally, at time $t_4$, a binary '00' is used to address multiplexer data port $d_0$ such that $Z = C$. Accordingly, all four input terminals X, A, B and C have been individually selected during the Measurement Mode.

In the Test Mode at time $t_6$, address line $OPTO_3$ goes high, such that resistor 52 is now connected to the output port Z at 45 through the forward-biased diode 50. Note that the diode 50 is serving the purpose of a switch, under the control of the address line $OPTO_3$, which connects a known impedance, resistor 52, to the multiplexer output port Z. Since the resistor 52 is now in the circuit, the voltage output at port Z is now proportional to the resistance measurement at terminal B made in parallel with the resistance of the known impedance 52. This is indicated at the bottom of FIG. 2b as B+ (terminal B "plus" resistor 52) measured during time interval $t_6$-$t_7$. Similarly, during time interval $t_7$-$t_8$, X+ is being measured. Resistance values A+ and C+ are then measured during time intervals $t_8$-$t_9$, and $t_9$-$t_{10}$, respectively.

In the preferred embodiment, the value of resistor 52 is 1,000,000 ohms. This value is much higher than the normal operating range of resistance values of the RTD, nominally 100 ohms, while it is much lower than the potentially infinite resistance value seen at the output of the multiplexer 44 if a wire is broken on the selected input port. In other words, in the Test Mode, the presence of the known impedance 52 would not significantly affect the voltage level at the output port Z when all the wires are connected to a relatively low-impedance RTD. However, if one of the wires is broken, the presence of the known impedance 52 will cause the output voltage level to drastically change, or rise in this case, if one of the RTD input connection wires is broken. Hence, if one of the connection wires 25 is broken such that one of the multiplexer inputs is open, the measured resistance value for that selected terminal will approximate that of resistor 52. Accordingly, if a multiplexer input is open, the frequency output of the V-to-F converter 32 will not be within a nominal RTD range when that particular multiplexer channel is addressed. Since the microcontroller 22 is controlling the address lines $OPTO_1$, $OPTO_2$, and $OPTO_3$, the microcontroller knows exactly which multiplexer input terminal X, A, B, or C is being addressed. Hence, the microcontroller can determine exactly which wire is broken, and indicate this information to the user via the display 36.

Figure 3A:
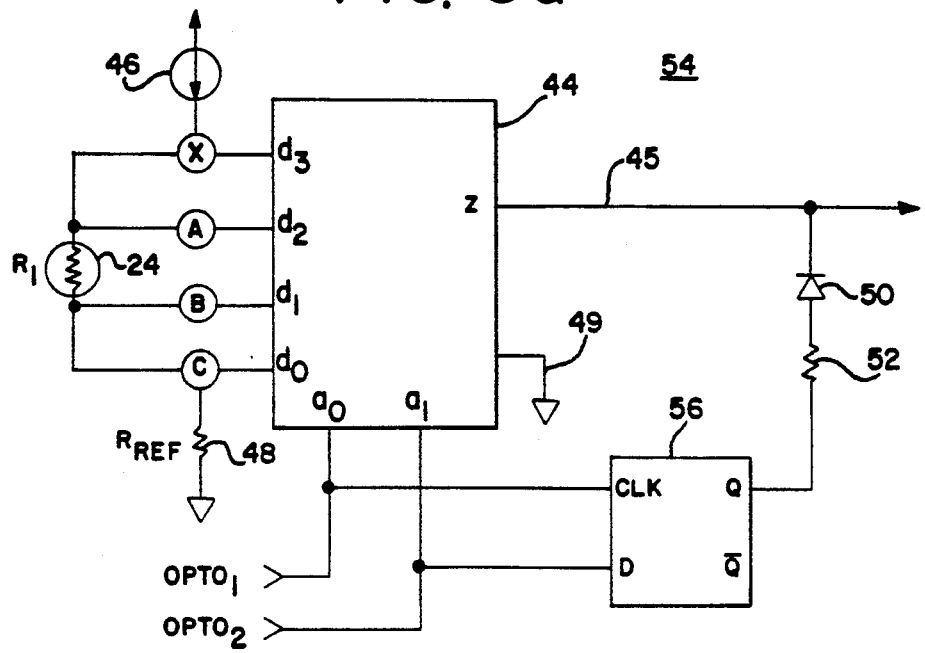
FIG. 3a is an alternate embodiment of the multiplexing circuitry of FIG. 2a, which has been modified to utilize only two address lines.
Figure 3B:
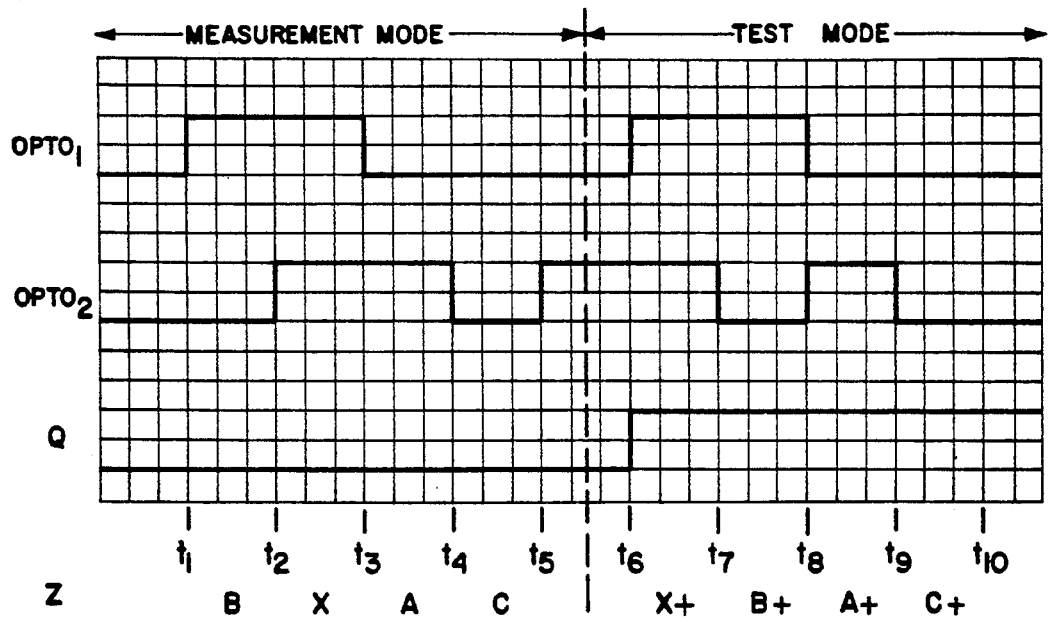
FIG. 3b shows representative waveforms at various points of FIG. 3a illustrating the circuit's operation.

FIG. 3a is an alternate embodiment of the multiplexing circuitry of FIG. 2a, which has been modified to utilize only two address lines. In the multiplexing circuit 54 of FIG. 3a, the third address line $OPTO_3$ has been eliminated through the addition of a D-type flip-flop 56. Address line $OPTO_1$ is connected to the clock input, and address line $OPTO_2$ is connected to the D input, respectively, of the D-flip-flop 56. The flip-flop output Q is connected to the resistor 52. If the D input is high, the Q output will go high on the next rising edge of the input clock waveform. Hence, the phase relationship between address lines OPTO$_1$ and OPTO$_2$ are used to determine the state of the D-flip-flop output Q, which now functions as the third address line OPTO$_3$. Referring now to FIG. 3b, the operation of the multiplexing circuitry 54 of FIG. 3a will be described. During the Measurement Mode, the multiplexer address line OPTO$_1$ always rises before the address line OPTO$_2$ such that the Q output of the flip-flop 56 remains low. With a low output Q, the diode 50 remains reversed biased, such that the known impedance 52 has no effect on the measurement of the voltage at output port Z. Hence, as shown at the bottom of FIG. 3b, the output port Z represents the resistance at terminals B, X, A and C, respectively.

However, note that the address line OPTO$_2$ remains high at time t$_6$, such that the Q output goes high upon the rising edge of OPTO$_1$. Therefore, during time interval t$_6$-t$_7$, the parallel combination of the resistance seen at input terminal X plus resistor 52, or X+, is being measured. Similarly, during time intervals t$_7$-t$_8$, t$_8$-t$_9$, and t$_9$-t$_{10}$, resistance values B+, A+, and C+, respectively, are measured in the Test Mode.

Figure 4A:
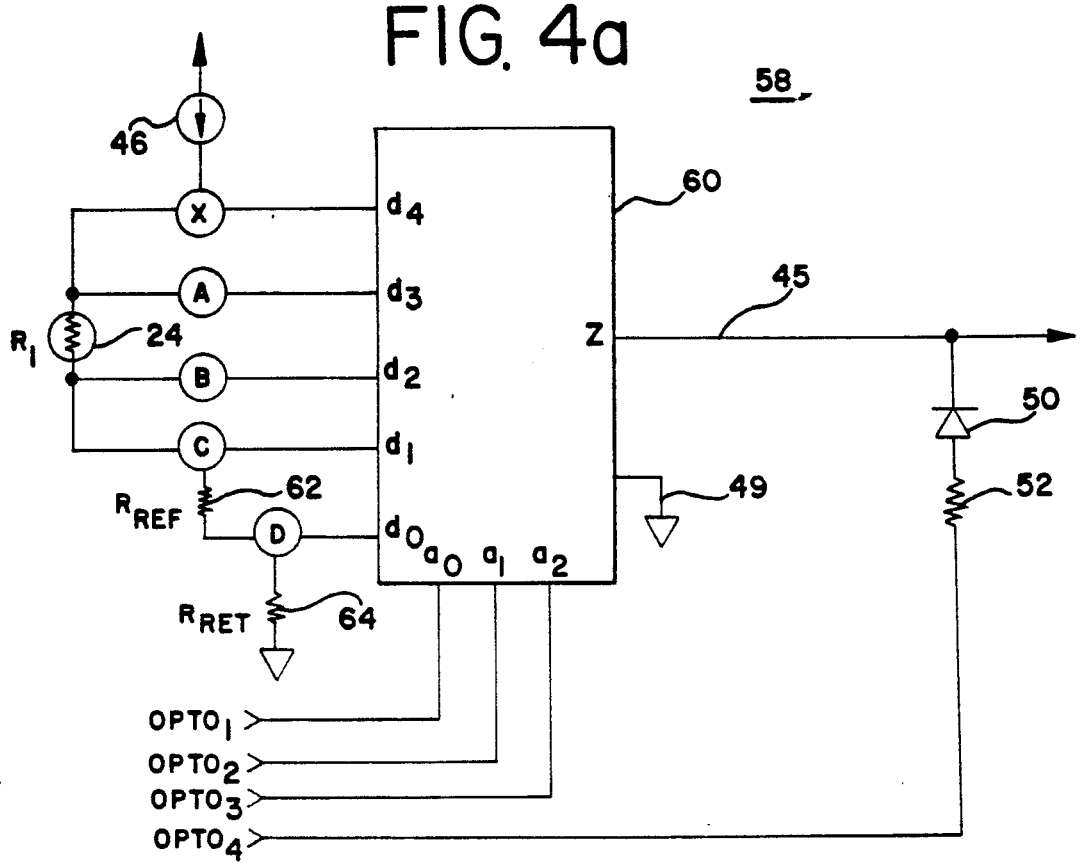
FIG. 4a is another simplified schematic diagram for the multiplexing circuit of FIG. 1, wherein an additional multiplexed input is utilized to more accurately determine the value of the reference resistor.

FIG. 4a is another simplified schematic diagram for the multiplexing circuit 28 of FIG. 1, wherein an additional multiplexed input, terminal D, is utilized to more accurately determine the value of the reference resistor R$_{REF}$. Note that the input terminal D is internal to the transmitter unit. Also note that an additional address line is required to select the additional input terminal D.

In multiplexing circuit 58, the reference resistor 62 is connected between input terminals C and D of the multiplexer 60, and is not directly connected to ground as before. Instead, a current return resistor R$_{RET}$ 64 is connected between input terminal D and ground as shown. In this way, the current from the current source 46 flows through the RTD 24, the reference resistor 62, and the return resistor 64, to ground. Instead of measuring the voltage V$_C$ to ground in order to determine the value of the reference resistor R$_{REF}$, two voltage measurements, V$_C$ to ground and V$_D$ to ground, are made such that the value of the reference resistor R$_{REF}$ is proportional to V$_C$−V$_D$. The use of this fifth internal terminal D allows the measurement of the reference resistor R$_{REF}$ to be completely differential, i.e., V$_C$−V$_D$, such that voltage offsets no longer affect the accuracy of the measurement. Hence, operational amplifiers may be used in the current source 46 which do not have a necessarily low offset differential specification. Since input bias and offset currents are no longer at issue, the circuit has substantially no Zero or Span error, except for the temperature coefficient of the reference resistor 62. The effect of any noise on the ground lines is also significantly reduced. In other words, in using this fifth input terminal configuration, a much more accurate determination of the reference resistor R$_{REF}$ can be achieved.

In order to measure the voltage V$_D$ at the additional input terminal D, an additional data port is required on the multiplexer. As shown in FIG. 4a, a five-channel analog multiplexer 60 is controlled by three address lines a$_0$, a$_1$, and a$_2$, which are connected to OPTO$_1$, OPTO$_2$, and OPTO$_3$, respectively. A fourth address line OPTO$_4$ is connected to the known impedance 52 as shown.

Figure 4B:
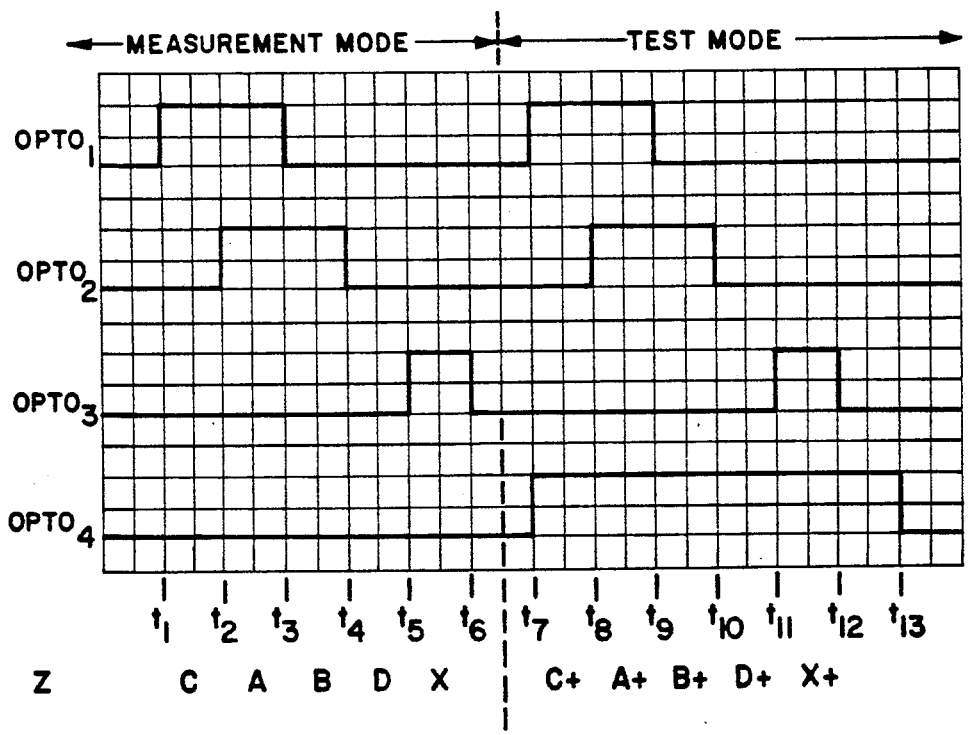

Referring now to FIG. 4b, representative addressing waveforms for the operation of the multiplexing circuit 58 of FIG. 4a are shown. In the Measurement Mode, the fourth address line OPTO$_4$ remains low, such that the other three address lines OPTO$_1$, OPTO$_2$, and OPTO$_3$ control the selection of the input terminal voltage which is applied to the output port Z. For example, during time interval t$_1$-t$_2$, a binary '001' is applied to the multiplexer 60, such that data port d$_1$ is selected, whereby the voltage at input terminal C is connected to output port Z. Again, this is shown at the bottom of FIG. 4b as Z=C. During time interval t$_2$-t$_3$, a binary '011' is used to select multiplexer data port d$_3$, such that Z=A. Similarly, input terminals B, D, and X are selected in accordance with the waveforms shown. At time t$_7$, the fourth address line OPTO$_4$ goes high in the Test Mode such that the known impedance 52 is switched into the circuit. Again, a binary '001' address is sent by the microcontroller to select input terminal C, such that Z=C+. A similar addressing scheme is used to select A+, B+, D+, and X+ as shown.

Figure 5:
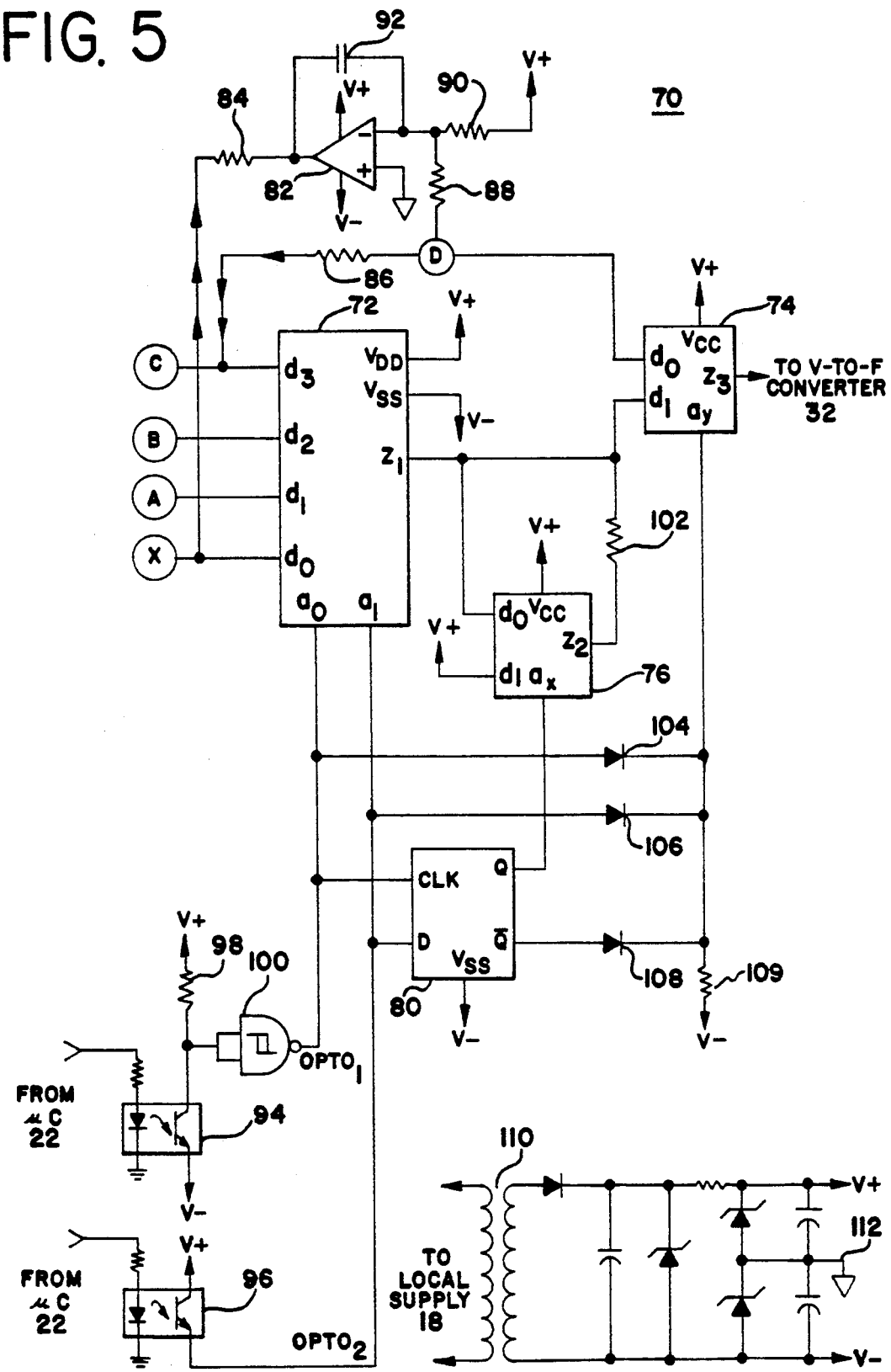
FIG. 5 is a detailed schematic diagram of the preferred embodiment for the multiplexing circuit of FIG. 1, wherein five multiplexed inputs are controlled by only two address lines.

FIG. 5 is a detailed schematic diagram of the preferred embodiment of the MUX 28 of FIG. 1, wherein five multiplexed inputs are controlled by only two address lines. In multiplexing circuit 70, the four external input terminals X, A, B and C, have been reversed from the previous figures to more accurately illustrate the operation of the current controller circuitry and the isolated power supply circuitry. As before, the two address lines OPTO$_1$ and OPTO$_2$ from the microcontroller 22 serve to control the four-channel analog multiplexer 72 via the optoisolator 30, and this circuitry operates substantially as explained above. However, an additional two-channel analog multiplexer 74 is used to multiplex the internal input terminal D with the output port Z$_1$ of the multiplexer 72, and thereby provide the output port Z$_3$ as the input to the voltage-to-frequency converter 32 of FIG. 1. Another difference in FIG. 5 from the previous circuit is that another two-channel analog multiplexer 76 is used as an electronic switch to perform the function of the diode 50, i.e., to control the switching of the known impedance in the Test Mode. Finally, note that a D-type flip-flop 80 is again used to eliminate the need for the third address line, and a diode-OR circuit is used to eliminate the need for the fourth address line.

The circuitry in the upper-left portion of FIG. 5 performs the function of the current controller 26 of FIG. 1. An operational amplifier 82, powered from a split voltage supply V+/V−, is used to sink current returning into the transmitter input terminal X to supply V− through a resistor 84. A resistor 86, which functions as the reference resistor R$_{REF}$, provides a source of current from V+ at input terminal D to the RTD via input terminal C. A resistor 88, also connected to terminal D, performs the function of the current return resistor R$_{RET}$. Biasing resistor 90 and feedback capacitor 92 serve their normal functions in the op-amp current source circuit.

In the preferred embodiment, two optoisolators 94 and 96 are used to generate the two address lines OPTO$_1$ and OPTO$_2$, as shown in the bottom-left portion of FIG. 5. The output ports from the microcontroller 22 are isolated from the address lines such that the RTD sensor can be connected to a ground reference point which may be hundreds of volts different from the ground of the two-wire transmitter, without the risk of a shock hazard or a malfunction. In the preferred embodiment, an invertor circuit, comprised of a resistor 98 and a Schottky NAND gate 100, are used to improve the switching waveform for the clock line to the flip-flop 80, since the optoisolator has a slow turn-off time.

As described above in accordance with FIG. 3a, the output Q of the D-type flip-flop 80 is used as the third address line, i.e., the Test Mode line, to address the analog multiplexer 76 via its address port $a_x$. The known impedance, i.e., a resistor 102, is connected from the output port $Z_1$ of the multiplexer 72 to the output port $Z_2$ of the multiplexer 76 as shown. When the Q output of the flip-flop is low, a zero is applied to the $a_x$ address port, such that the multiplexer data port $d_0$ is selected. This connects the output $Z_1$ of the multiplexer 72 to the output $Z_2$ of the multiplexer 76, effectively shorting-out the resistor 102 such that the known impedance is not in the circuit. In the Test Mode, however, the Q output goes high, such that the resistor 102 is connected to the positive supply voltage V+ at multiplexer data port $d_1$, thus connecting the resistor 102 into the circuit.

In either case, the output $Z_1$ of the multiplexer 72 is connected to the data port $d_1$ of the multiplexer 74. The internal input terminal D, which is used to measure the voltage across the reference resistor 86, is connected to the other multiplexer data port $d_0$. Still another address line, $a_y$, is used to switch between data ports $d_0$ and $d_1$ to provide the output $Z_3$ to the V-to-F converter 32. The address line $a_y$ is controlled by a combination of the address lines OPTO$_1$ and OPTO$_2$, and the inverted-Q output of the flip-flop 80, all configured as an OR gate through diodes 104, 106, and 108, and a pull-down resistor 109, as shown. Hence, whenever OPTO$_1$ or OPTO$_2$ or inverted-Q is high, the address port $a_y$ will be high, and the output port $Z_1$ will be connected to the output $Z_3$ through the multiplexer 74. Switching waveforms will be shown below for the various input configurations.

As shown in the bottom-right portion of FIG. 5, the isolated power supply circuit 20 of FIG. 1 is comprised of a transformer 110 and several other standard components as shown. A DC-to-AC converter in the local supply 18 provides AC to the transformer 110. The isolated AC voltage is then rectified, filtered, and split into two regulated supplies such that V+ is approximately 2.5 volts DC above the ground reference 112, and V− is approximately 2.5 volts DC below the ground reference 112. Numerous other isolated supply configurations may also be used.

The following part numbers and values are representative of those used in the preferred embodiment:

| Component | Type/Value |
|---|---|
| Multiplexer 72 | CD 4052 |
| Multiplexers 74, 76 | CD4053 |
| D flip-flop 80 | CD 4013 |
| Op-amp 82 | TLC27L7 |
| R$_{REF}$ 86 | 301 ohm, 1%, 5 ppm/°C. |
| R$_{RET}$ 88 | 100 ohm |
| R84 | 499 ohm |
| R90 | 10K ohm |
| R98 | 100K ohm |
| R102 | 1 Meg ohm |
| R109 | 1 Meg ohm |

Of course, other component types and values may be used for different applications or other circuit configurations.

Figure 6A:
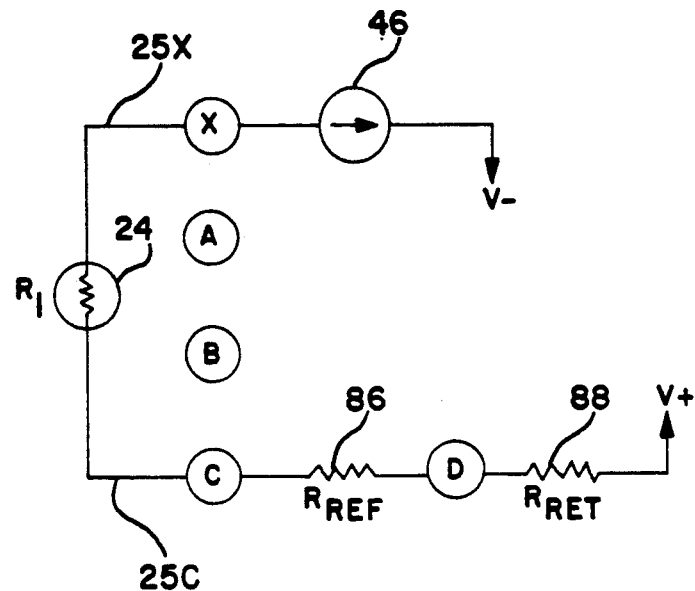
FIG. 6a is a schematic diagram illustrating the input circuit configuration for the multiplexer of FIG. 5 when a two-wire RTD sensor is used without lead-length compensation.

FIG. 6a is a schematic diagram illustrating the input circuit configuration for the multiplexer of FIG. 5 when a two-wire RTD sensor is used without lead-length compensation. The RTD 24 is connected via two connection wires 25X, 25C, to the input terminals X, C, of the multiplexer 72 of FIG. 5. The excitation current I flows from V+, through R$_{RET}$ 88 to terminal D, through R$_{REF}$ 86, out of terminal C, through R$_1$, into terminal X, through current source 46, and back to V−. Note that while the direction of the current source 46 and the polarity of the supply voltages V+, V−, remain the same as that of FIG. 5, resistor 90 and the op amp 82 have been omitted for purposes of simplification. Also note that the input terminal X is connected to multiplexer data port $d_0$ as shown in FIG. 5, as opposed to being connected to the higher-order data ports $d_3$ or $d_4$ as was the case for the figures previous to FIG. 5.

As will be explained in more detail in the flowchart below, the frequency values corresponding to the voltages at input terminals A, B, C, D, and X are measured as required for the particular input sensor configuration. Each value is read for approximately 300 milliseconds (ms). A table of the five most recent frequency values is kept for each input terminal. The five values are averaged, calibrated to correct the voltage-to-frequency conversion, scaled to account for any voltage-to-frequency converter drift, and then used in the resistance formula for the particular input sensor configuration. The resulting resistance value is corrected for calibration errors, converted to temperature utilizing either a table of resistance-temperature values or a polynomial equation, and linearized using the particular temperature coefficient for the input sensor. The final temperature value is then saved. If a multi-sensor configuration is used, the various linearized temperature values may be combined to form a differential temperature measurement.

In the two-wire single-sensor configuration illustrated in FIG. 6a, the resistance formula is:

$$R_1 = [(V_X - V_C)/(V_C - V_D)]R_{REF}, \quad (6)$$

and the value $V_X$ is termed the most active variable, since its value changes more often than the other variables. This is due to the fact that the current I through the circuit is essentially constant, so that $V_C$ and $V_D$ change very little. Since $R_1$ changes with temperature, $V_X$ also changes with temperature. Accordingly, input terminal X, which corresponds to the most active variable $V_X$, is usually read by the microcontroller more often than the other variables.

Figure 6B:
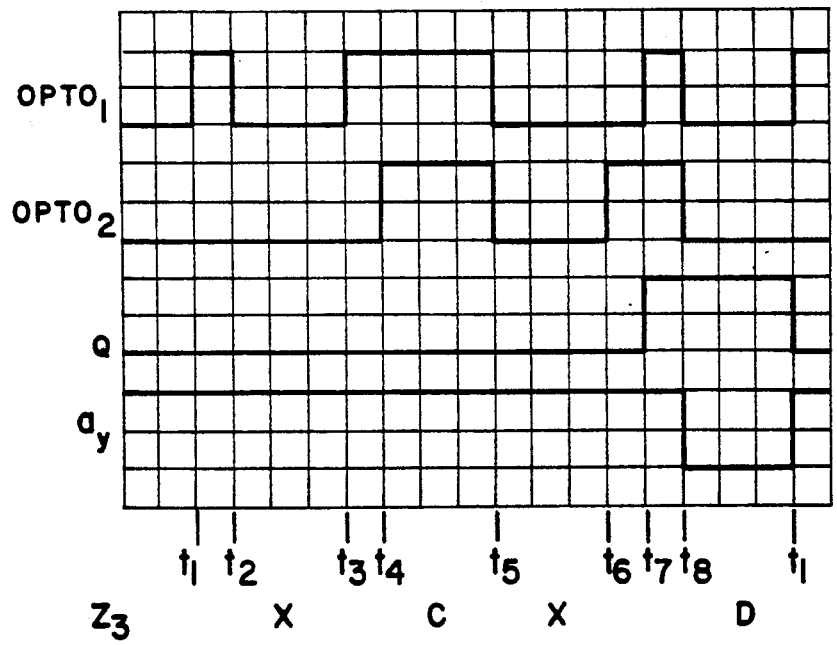

Now referring to FIG. 6b, a waveform timing diagram for the operation of the circuit of FIG. 5 is shown when used with the input configuration of FIG. 6a. The timing diagram illustrates the two address lines OPTO$_1$ and OPTO$_2$ as seen at the address ports $a_0$ and $a_1$ of the multiplexer 72. Hence, OPTO$_1$ and OPTO$_2$ control the multiplexing of the four input terminals X, A, B, and C. The third waveform, labeled Q, represents the voltage level at the output Q of the flip-flop 80, which is connected to address port $a_x$ of the multiplexer 76. Therefore, the waveform Q represents the control signal for the switch that connects the resistor 102 into the circuit for the Test Mode. The fourth waveform, labeled $a_y$, represents the logical OR of OPTO$_1$, OPTO$_2$ and the inverted-Q output of the flip-flop 80, as seen at the address port $a_y$ of the multiplexer 74. Hence, this address port $a_y$ effectively represents the third address line for multiplexing the fifth input terminal D. Finally, the designation $Z_3$ at the bottom of FIG. 6b represents the output port of the multiplexer 74. The $Z_3$ waveform illustrated which input terminal is being individually selected by the multiplexing circuit 70 of FIG. 5 during particular time intervals. Note that in using the two-wire RTD sensor configuration, there is no Test Mode per se. If the connection wire 25X to input terminal X was broken, the voltage at input terminal X would approximate V−, such that the microcontroller would read the frequency output of the V-to-F converter to be an over-range value. Similarly, if the connection wire 25C to input terminal C was broken, the voltage at terminal C would approximate that of V+, such that the frequency output of the V-to-F converter would be zero, or under-range.

At time $t_1$ of FIG. 6b, the microcontroller directs address line $OPTO_1$ to go high. Since $OPTO_1$ is connected as the clock line of the flip-flop 80, and since $OPTO_2$ is low at this time, the flip-flop is cleared such that the Q output remains low. Address line $OPTO_1$ remains high for approximately 150 microseconds ($\mu s$) and goes low at time $t_2$. The microcontroller does not measure any parameters during time interval $t_1$-$t_2$, so nothing is shown for the $Z_3$ output.

During the time interval $t_2$-$t_3$, a binary '00' address is applied to the multiplexer 72 such that data port $d_0$ is selected. Accordingly, the voltage value from input terminal X to ground is seen at the multiplexer output $Z_1$. Since the flip-flop output Q is low, data port $d_0$ of the multiplexer 76 is selected such that resistor 102 is out of the circuit. Finally, since the address line $a_Y$ is high during this time interval, data port $d_1$ of the multiplexer 74 is selected as the output $Z_3$ to the V-to-F converter 32. As can be seen at the bottom of FIG. 6b, the output $Z_3$ represents the value of terminal X during the time interval $t_2$-$t_3$. In the preferred embodiment, this time interval $t_2$-$t_3$, used for reading input terminal X, is approximately 300 ms.

At time $t_3$, $OPTO_1$ goes high, and 150 $\mu s$ later at time $t_4$, $OPTO_2$ goes high, such that a binary '11' is applied to the multiplexer 72. The address line $OPTO_1$ must go high before $OPTO_2$ in order to ensure that the Q output of the flip-flop remains low. During the time interval $t_4$-$t_5$, the voltage at the input terminal C to ground is seen at output $Z_3$. Again, input terminal C is being read by the microcomputer for approximately 300 ms.

At time $t_5$, both $OPTO_1$ and $OPTO_2$ go low, such that the input terminal X is again being read by the microcomputer. As explained above, terminal X represents the most active variable, and, accordingly, this value is updated twice per measurement cycle.

At time $t_6$, $OPTO_2$ goes high, such that the Q output of the flip-flop goes high with the rising edge of $OPTO_1$ at time $t_7$. Again, the time interval needed to ensure that the flip-flop is set, i.e., the time interval $t_6$-$t_7$, is on the order of 150 $\mu s$. Once, the Q output is latched high, the address line $OPTO_1$ can go low at time $t_8$ such that the address line $a_Y$ can also go low. Accordingly, during the time interval $t_8$-$t_1$, input terminal D is being read as the output $Z_3$ of the circuit. At time $t_1$, $OPTO_1$ is again set high such that the flip-flop is clocked with $OPTO_2$ low. Hence, the Q output is reset low, the address line $a_Y$ is reset high, and the next measurement cycle begins.

Figure 7A:
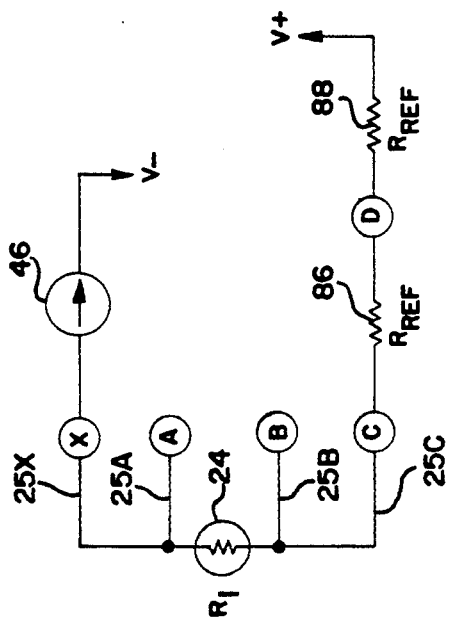
FIG. 7a is a schematic diagram illustrating the input configuration for the multiplexer of FIG. 5 when a four-wire RTD sensor is used.

FIG. 7a is a schematic diagram illustrating the input configuration for the multiplexer of FIG. 5 when a four-wire RTD sensor is used. The four-wire sensor configuration of FIG. 7a differs from the two-wire configuration of FIG. 6b in that a third wire 25A and a fourth wire 25B are used as voltage sensing wires connected to the multiplexer 72. Using this four-wire RTD configuration, the resistance of the RTD is calculated using the following equation:

$$R_1 = [(V_A - V_B)/(V_C - V_D)]R_{REF}. \quad (7)$$

In this configuration, $V_A$ is the most active variable for RTD measurement, since $V_B$, $V_C$, and $V_D$ change very slowly if at all, while $V_A$ varies directly with the sensor's resistance. Note that $V_X$ is as active as $V_A$, although it is not used in the resistance equation. Hence, in the preferred embodiment, input terminal A is updated approximately three times per second, and input terminals A and B are checked for broken wires approximately every two seconds.

Note that only terminals A and B need to be checked by the microcontroller for broken wires in the Test Mode, since a break in any other wires will be detected in the normal Measurement Mode. In other words, if terminal X is open, then the voltage $V_X$ at terminal X will approximate V−, while $V_A$, $V_B$, and $V_C$ will all equal V+. Accordingly, the microprocessor will see an over-range frequency value for X, while a zero frequency value for A, B, and C. This condition indicates that terminal X is open. Similarly, if terminal C is open, then $V_X$, $V_A$, and $V_B$ will all approximate V− and produce an over-range frequency value, while $V_C$ will be at V+ and therefore zero Hertz. In the Test Mode, if the voltage sensing wire 25A to terminal A is open, then $V_A$ will be at an unknown voltage value at a high impedance, such that the voltage for A+, i.e., the parallel combination of the A terminal impedance and the known impedance connected to V+, will be equal to V+. If terminal A were not open, then the low impedance on terminal A would cause the parallel combination to be within range or low. The same result would occur for B+ if terminal B were open. In other words, an open wire to terminals A or B will correspond to zero frequency for A+ or B+.

Figure 7B:
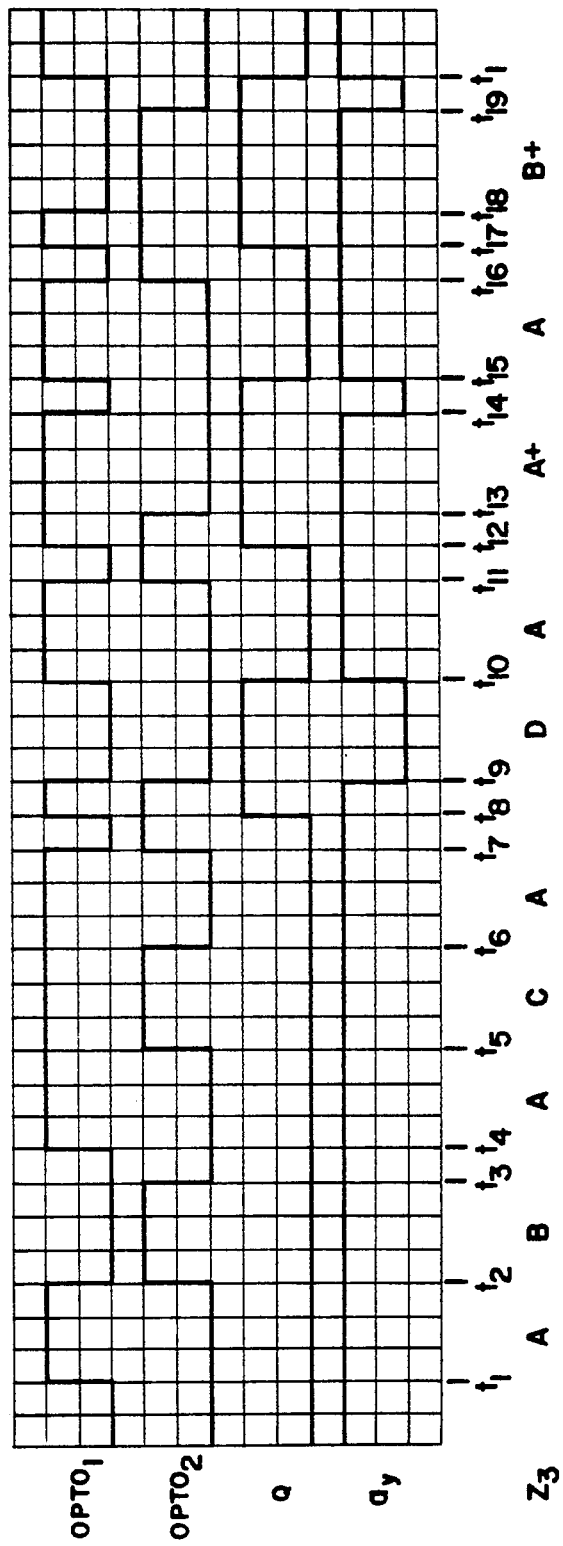

FIG. 7b illustrates the timing waveforms for the four-wire RTD sensor configuration of FIG. 7a. Note that portions of the Test Mode are interleaved with portions of the Measurement Mode in order to more efficiently perform the functions of both modes. At time $t_1$, the rising edge of $OPTO_1$, when $OPTO_2$ is low, ensures that the Q output remains low and the address line $a_Y$ remains high. During time interval $t_1$-$t_2$, a binary '01' is applied to the multiplexer 72, such that the data port $d_1$ is connected to output port $Z_1$ for reading the voltage at input terminal A. Since the Q output is low, the multiplexer circuit 70 remains in the Measurement Mode, and the resistor 102 is out of the circuit. During time interval $t_2$-$t_3$, a binary '10' is applied to the multiplexer 72, such that input terminal B is being read. Each of the these time intervals is approximately 300 ms.

At time $t_3$, $OPTO_2$ goes low to ensure that the rising edge of $OPTO_1$ at time $t_4$ does not set the Q output high. Time interval $t_3$-$t_4$ is approximately 4 ms, to prevent a slow fall time on $OPTO_2$, i.e., slower than the rise time of $OPTO_1$, from allowing the circuit to go into the Test Mode. As a result, input terminal A, representing the most active variable, is again read for approximately 300 ms during time interval $t_4$-$t_5$. Input terminal C is read during time interval $t_5$-$t_6$, and input terminal A is again read during time interval $t_6$-$t_7$.

At time $t_7$, $OPTO_2$ goes high in order to latch the Q output high with the rising edge of $OPTO_1$ at time $t_8$. Time interval $t_7$-$t_8$, in the preferred embodiment, is approximately 4 ms in length, which is sufficient time to prevent a slow fall time on $OPTO_1$ from improperly affecting the operation of the circuit. Even though the Q output is high during the time interval $t_9$-$t_{10}$, the address line $a_Y$ is low, such that input terminal D is being read during the Measurement Mode. During time interval $t_{10}$-$t_{11}$, the value of the A input terminal is again updated. At time $t_{11}$, $OPTO_2$ goes high such that the Q output goes high 150 $\mu s$ later with the rising edge of $OPTO_1$ at time $t_{12}$.

At time $t_{13}$, $OPTO_2$ goes low, and the Test Mode is entered in order to detect a broken wire at input terminal A. As can be seen from the waveforms, a binary '01' is applied to the multiplexer 72, such that the data port $d_1$ is connected to the output port $Z_1$. Since the Q output is high, data port $d_1$ of the multiplexer 76 is connected to its output $Z_2$, such that the lower end of resistor 102 is connected to V+. Hence, terminal A, plus the known impedance, is being read as the value at the output port $Z_3$, i.e., $Z_3 = A+$.

At the end of the 4 ms time interval $t_{14}$-$t_{15}$, the Q output is reset such that the input terminal A can be again be measured in the Measurement Mode during time interval $t_{15}$-$t_{16}$. During time intervals $t_{16}$-$t_{18}$, the Q output is again set high, and input terminal B is selected such that the value of B+ can be measured in the Test Mode during the time interval $t_{18}$-$t_{19}$. Finally, $OPTO_2$ goes low at time $t_{19}$ such that the Q output is reset at time $t_1$, and the measurement cycle is again restarted.

Figure 8A:
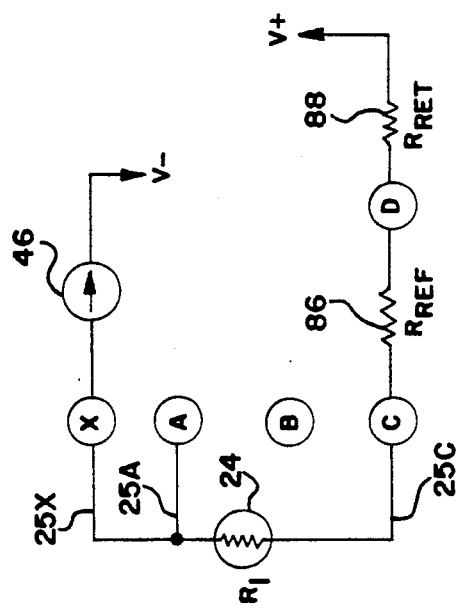
FIG. 8a is a schematic diagram illustrating the input configuration for the multiplexer of FIG. 5 using a three-wire RTD sensor.

FIG. 8a is a schematic diagram illustrating the input configuration for the multiplexer of FIG. 5 using a three-wire RTD sensor configuration. As can be seen from the figure, only one voltage sensing line 25A is used in this embodiment. Accordingly, the RTD resistance calculation formula is:

$$R_1 = [((V_A - V_C) - (V_X - V_A))/(V_C - V_D)]R_{REF}, \text{ or} \quad (8)$$

$$R_1 = [(2V_A - V_C - V_X)/(V_C - V_D)]R_{REF}. \quad (9)$$

Again, A is the most active variable because C and D are relatively stable, and X is as active as A. Note that only terminal A needs to be checked during the Test Mode. If terminal X is open, then the variable X will be over-range and A and C will be zero Hertz. If terminal C is open, then X and A will be over-range, and C will be zero Hertz.

Figure 8B:
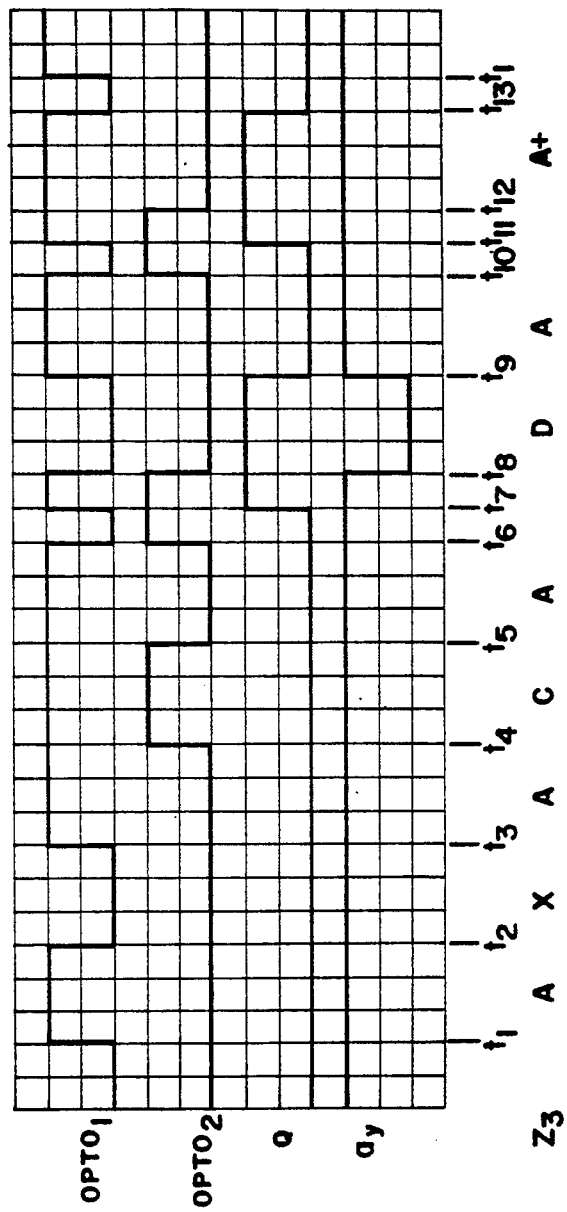

The timing waveforms for the three-wire sensor configuration of FIG. 8a are shown in FIG. 8b. The operation of the circuit of FIG. 5 with the three-wire RTD configuration is similar to that of the previous two figures, except that the sequence of variables read into the microcontroller are different, as shown at the bottom of FIG. 8b as $Z_3$. Again, each Measurement Mode or Test Mode input terminal reading period is approximately 300 ms, while time intervals $t_6$-$t_7$, $t_{10}$-$t_{11}$, and $t_{13}$-$t_1$ are approximately 4 ms. Time intervals $t_7$-$t_8$ and $t_{11}$-$t_{12}$ are approximately 150 $\mu s$.

Figure 9A:
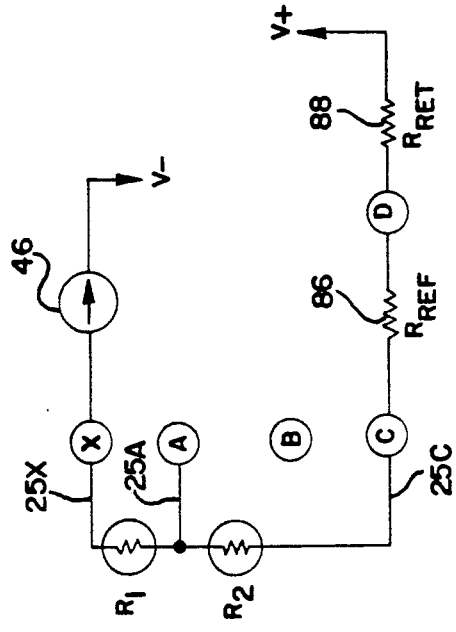
FIG. 9a is a schematic diagram illustrating the input configuration for the multiplexer of FIG. 5 having a three-wire dual-RTD sensor configuration using no lead-length compensation.

FIG. 9a is a schematic diagram illustrating the input configuration for the multiplexer of FIG. 5 having a three-wire dual-RTD sensor configuration using no lead-length compensation. Two RTDs are often used for differential temperature measurements. However, in all prior two-wire transmitter systems, a true differential temperature measurement is not possible. In the preferred embodiment, however, the resistance values of each RTD sensor $R_1$, $R_2$ are individually calculated such that a true differential temperature measurement can be made. Accordingly, the resistance formulas used with the three-wire dual-RTD input configuration are as follows:

$$R_1 = [(V_X - V_A)/(V_C - V_D)]R_{REF}, \text{ and} \quad (10)$$

$$R_2 = [(V_A - V_C)/(V_C - V_D)]R_{REF}. \quad (11)$$

As before, only the input terminal A needs to be checked in the Test Mode, since if the wire 25X to terminal X were broken, the X frequency value would be over-range and the A and C frequency values would be zero Hertz. Similarly, if the wire 25C to terminal C were broken, then the X and A frequency values would be over-range, and the C frequency value would be zero Hertz.

Figure 9B:
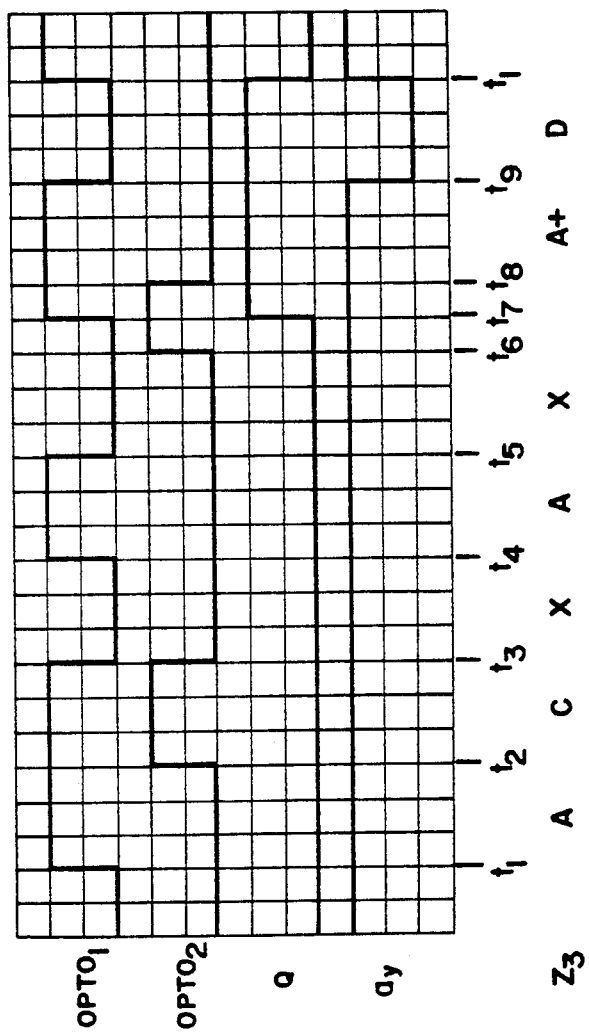

FIG. 9b illustrates the timing waveforms for the input configuration of FIG. 9a. From the waveforms, it can be seen that terminals A, C, X, A, and X are first measured in the Measurement Mode, then terminal A plus the known resistance 102 is measured during time interval $t_8$-$t_9$ in the Test Mode. Finally, terminal D is measured in the Measurement Mode during time interval $t_9$-$t_1$.

Figure 10A:
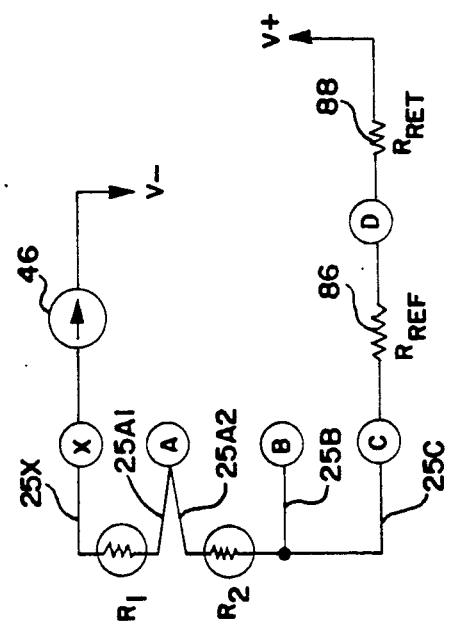
FIG. 10a is a schematic diagram illustrating the input configuration for the multiplexer of FIG. 5 having a five-wire dual-RTD sensor configuration utilizing lead-length compensation.

FIG. 10a is a schematic diagram illustrating the input configuration for the multiplexer of FIG. 5 having a five-wire dual-RTD sensor configuration utilizing lead-length compensation. This five-wire dual-RTD input configuration utilizes connection wire 25B to compensate for the other lead lengths. The resistance formulas, however, become rather complicated:

$$R_1 = [((V_X - V_A) - 2(V_B - V_C))/(V_C - V_D)]R_{REF}, \text{ and} \quad (12)$$

$$R_2 = [((V_A - V_B) - (V_B - V_C))/(V_C - V_D)]R_{REF}. \quad (13)$$

Terminals X and A represent the most active variables. Both terminals A and B are checked in the Test Mode. If wire 25X to terminal X or wire 25A1 to terminal A is open, such that $R_1$ is open, the microcontroller will receive an over-range frequency value for X and a zero frequency value for A, B, and C. If wire 25A2 to terminal A is open, or $R_2$ is open, then the controller will receive an over-range frequency value when reading terminals A and X, and a zero frequency value for terminals B and C in the Measurement Mode. If wire 25B to terminal B is open, a zero frequency value will be received for B+ in the Test Mode. Finally, if wire 25C is open, then terminals X, A, and B will be over-range frequency values and terminal C will be a zero frequency value in the Measurement Mode.

Figure 10B:
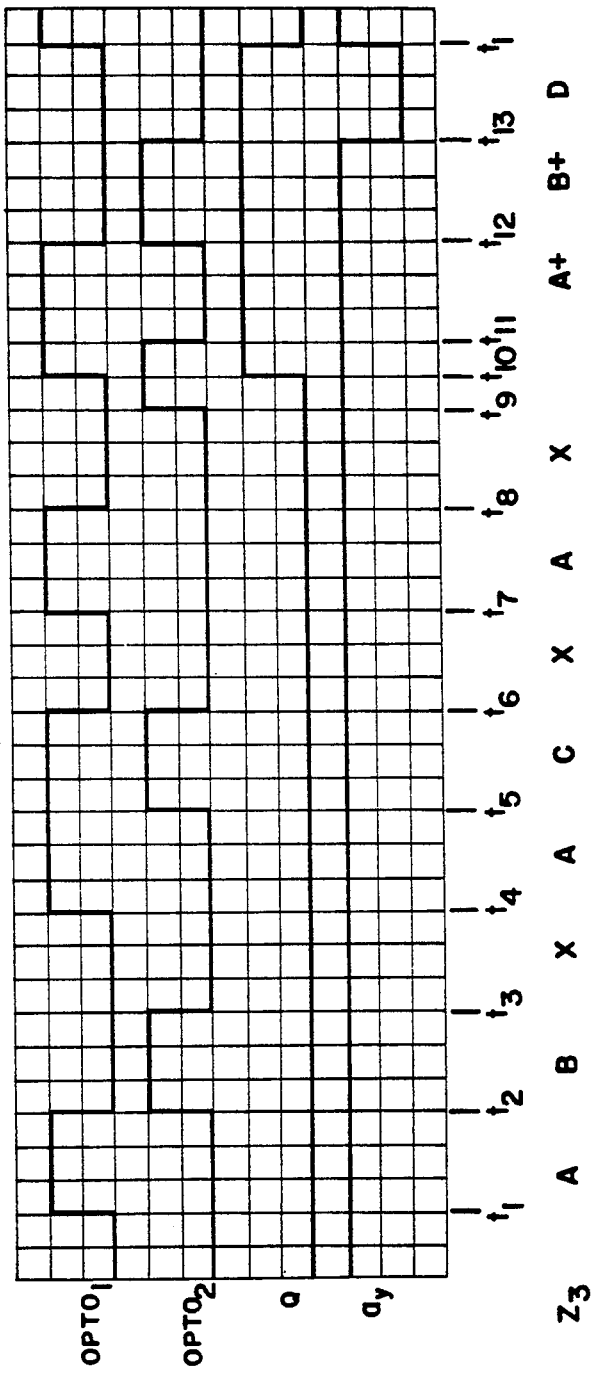

From the timing waveform illustrated in FIG. 10b, it can be seen that the five-wire dual-sensor configuration of FIG. 10a only utilizes the Test Mode during time intervals $t_{11}$-$t_{12}$ and $t_{12}$-$t_{13}$. During the other times, terminals A, B, C, D, and X are measured as shown.

Figure 11A:
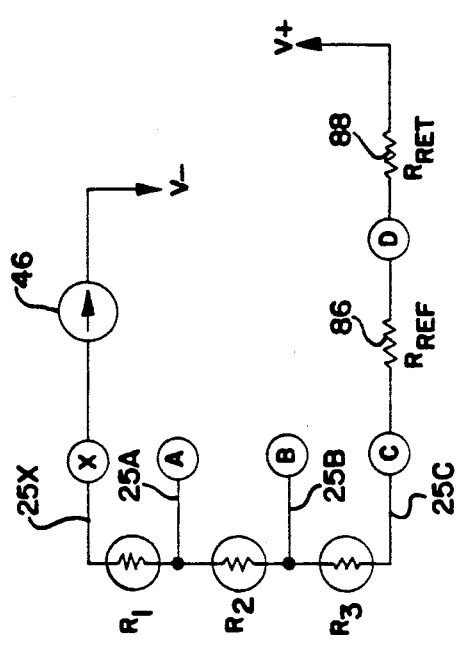
FIG. 11a is a schematic diagram illustrating the input configuration for the multiplexer of FIG. 5 having a three-RTD sensor configuration.

FIG. 11a is a schematic diagram illustrating the input configuration for the multiplexer of FIG. 5 having a three-RTD input configuration. No lead-length compensation is being performed. The resistance formulas are:

$$R_1 = [(V_X - V_A)/(V_C - V_D)]R_{REF}, \quad (14)$$

$$R_2 = [(V_A - V_B)/(V_C - V_D)]R_{REF}, \text{ and} \quad (15)$$

$$R_3 = [(V_B - V_C)/(V_C - V_D)]R_{REF} \quad (16)$$

Terminals X, A, and B represent the most active variables. If wire 25X is open, the frequency value for X will be over-range, and that of A, B, and C will be zero. If wire 25A is open, then A+ will be zero in the Test Mode. Similarly, for wire 25B, B+ will be zero in the Test Mode. If wire 25C is open, then X, A, and B will over-range and C will be zero in the Measurement Mode.

Figure 11B:
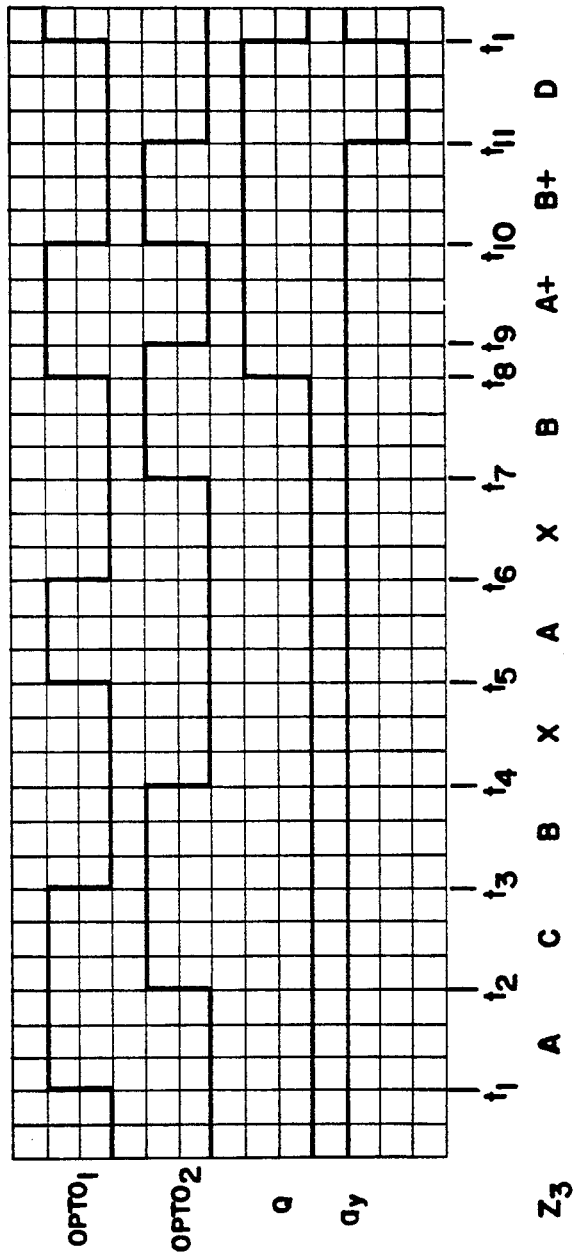

As before, FIG. 11b illustrates the corresponding timing waveforms for the three-RTD input configuration shown above. In the Measurement Mode, the variables A, C, B, X, A, X, and B are read before A+ and B+ are measured in the Test Mode. Finally, the D variable is measured in the Measurement Mode. Note that the multiplexing scheme of FIG. 11a includes the ability to independently measure the value of three different temperature sensors, and to compute the average of the three temperature sensors in the microcontroller. However, no lead-length compensation is being performed.

Figure 12:
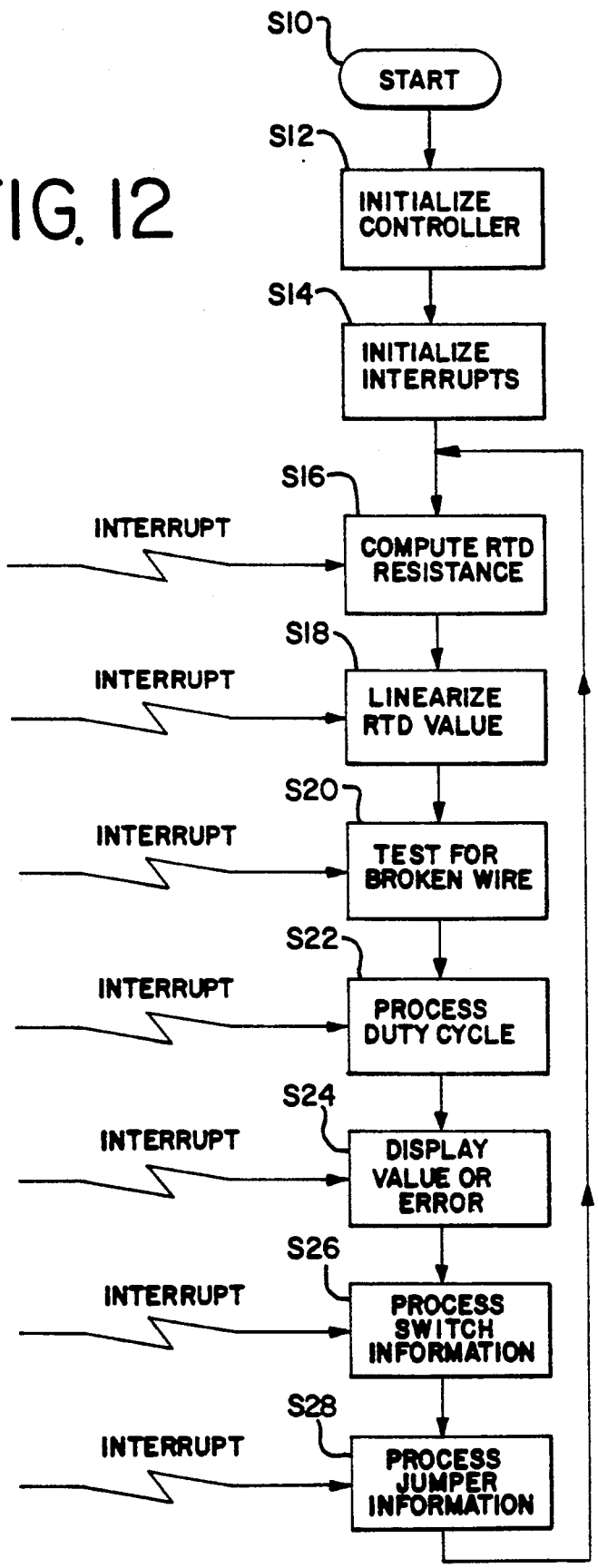
FIG. 12 is a flowchart illustrating the specific sequence of operations performed by the microcontroller of FIG. 1 in accordance with the practice of the preferred embodiment of the present invention.

FIG. 12 is a flowchart illustrating the specific sequence of operations performed by the microcontroller of FIG. 1, as used with the multiplexing circuitry 70 of FIG. 5, in accordance with the practice of the preferred embodiment of the present invention. Beginning with the start step S10, the microcontroller 22 is initialized at step S12 by a hardware reset or power-up reset. The initialization step also includes diagnostic tests, and hardware and software setup, e.g., clearing memory, initializing variables, etc. The interrupts are initialized at step S14. As will be seen below, the microcontroller utilizes a interrupt-driven programming routine, wherein the main measurement cycle, comprised of steps S16-S28, are temporarily halted upon the occurrence of an interrupt. Note that the interrupts can occur any time during the main measurement cycle.

Figure 13:
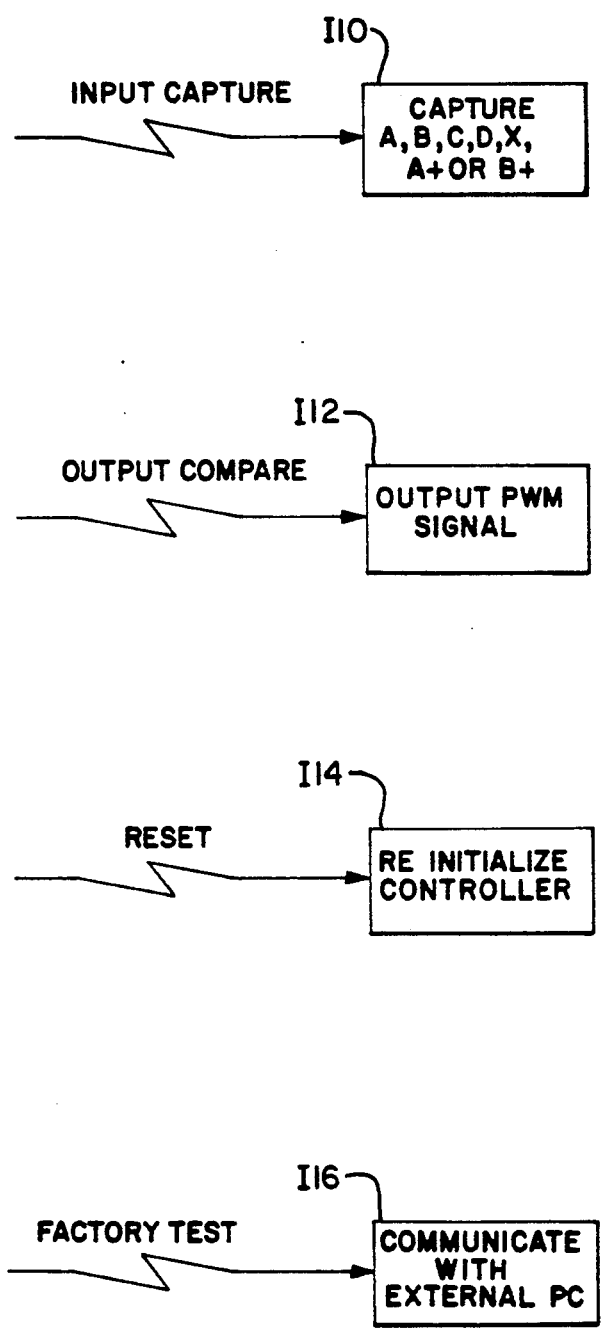
FIG. 13 is a flowchart illustrating the various interrupt operations performed by the microcontroller in the preferred embodiment.

Referring momentarily to FIG. 13, the various interrupt operations performed by the microcontroller are illustrated. At input capture interrupt step I10, the input frequencies for the input terminals A, B, C, D, X, A+, or B+ are captured. As explained above, the measured voltage levels at these input terminals are multiplexed by the MUX circuit 28 and are applied to the voltage-to-frequency converter 32 to convert the levels into digital pulses. These frequency pulses are applied through the optoisolator 34 to the microcontroller 22, wherein an interrupt is generated for each pulse. The input capture interrupt routine I10 increments the number of pulses counted per cycle, (i.e., "counts"), saves the system clock time for the first pulse of the cycle ("old clock"), and updates the latest pulse time signature ("new clock") until a new cycle is started at the end of a 300 ms measurement cycle. A timing module saves the accumulated clocks and counts as the measured input value [A,B,X,A+,B+]. For points C and D this value is the latest of a set of eight readings for the measured value of the C or D input variables.

Now referring back to step S16 of FIG. 12, the RTD resistance is computed using the information from the input capture interrupt routine I10. The clocks and count information for each input terminal are selected for the 300 ms measurement duration, whereby the next input terminal in the sequence is measured. After 300 ms of capturing time, the old and new clock values are subtracted and saved with their number of accumulated counts or pulses. The capture variables are then reset, and the hardware is switched to measure the next input terminal. The captured clocks and counts are then limit checked. If these values would correspondence to frequencies greater than 850 Hertz or less then 10 Hertz, a fault indication is provided to the user via the display 36. Otherwise, the inputs for A, B, and X are scaled to ohms. The eight most recent values for input terminals C or D are averaged and scaled to form data points representative of the resistances at the input terminals. The data points are then combined using the aforementioned resistance formulas described above. A raw resistance value for each RTD sensor is then stored in RAM.

In step S18, the raw resistance value is linearized by applying factors from a linearization error table to the raw resistance values for $R_1$, $R_2$ and/or $R_3$. The linearization error table is comprised of empirically-determined coefficients for linearizing the resistance-verses-temperature curve of each RTD as a function of measured voltage across the RTD. Linearization tables are known in the art. Moreover, linearization may not required for certain types of condition sensors.

Depending upon the input sensor configuration, the linearized RTD values may then be combined and stored as a combined result. Similarly, the linearized resistance values may be subtracted and the difference between two RTDs stored, or the average of two or three sensors may be computed. In the prior art, the differential resistance between RTDs would be measured, assuming each resistor temperature coefficient is linear. This is not a correct assumption, particularly if a wide range of temperatures are measured. Hence, the present invention permits linearization in software for each RTD independently of each other. Note that in the multi-RTD sensor configurations shown in FIG. 9a, 10a, and 11a, each of the individual RTD sensors can be linearized individually before being compared to the other RTD to determine the differential or average temperature measurement.

In step S20 the microcontroller tests for broken wires, i.e., open connections at the input terminals. For broken wire testing, only the latest result for the measured values of X, A, B, C, D, A+, and B+ (as required) is used. As explained above, the broken wire test analysis is different for each of the input sensor configurations described above. Table 1 provides a summary of the broken wire analysis performed by the microcontroller 22.

TABLE 1

| Condition: | Error: |
|---|---|
| For 2-wire sensors (FIG. 6a) | |
| X = OVER-RANGE and C = ZERO | $R_1$ = open |
| For 4-wire sensors (FIG. 7a) | |
| A & B & C = ZERO and X = OVER-RANGE | X = open |
| A+ = ZERO | A = open |
| B+ = ZERO | B = open |
| A & B & X = OVER-RANGE and C = ZERO | C = open |
| For 3-wire sensors (FIG. 8a) | |
| X = OVER-RANGE and A & C = ZERO | X = open |
| A+ = ZERO | A = open |
| X & A = OVER-RANGE and C = ZERO | C = open |
| For dual sensors w/out compensation (FIG. 9a) | |
| A & C = ZERO and X = OVER-RANGE | $R_1$ = open |
| X & A = OVER-RANGE and C = ZERO | $R_2$ = open |
| A+ = ZERO | A = open |
| For dual sensors w/compensation (FIG. 10a) | |
| A & B & C = ZERO and X = OVER-RANGE | $R_1$ = open |

TABLE 1-continued

| Condition: | Error: |
|---|---|
| X & A = OVER-RANGE and C = ZERO | R$_2$ = open |
| A & B & X = OVER-RANGE and C = ZERO | C = open |
| A+ = ZERO | A = open |
| B+ = ZERO | B = open |
| For triple sensors (FIG. 11a) | |
| A & B & C = ZERO and X = OVER-RANGE | R$_1$ = open |
| X & A = OVER-RANGE and B & C = ZERO | R$_2$ = open |
| A & B & X = OVER-RANGE and C = ZERO | R$_3$ = open |
| A+ = ZERO | A = open |
| B+ = ZERO | B = open |

In step S22 of FIG. 12, the microcontroller processes the duty cycle information, i.e., it converts the linearized RTD values into duty cycle information. Every 300 ms, the linearized RTD values are converted into a desired duty cycle parameter for pulse-width modulation of the current modulator 17 shown in FIG. 1. The duty cycle is expressed as a percentage of on-time verses off-time. The duty cycle is calculated from the linearized RTD values by applying a combination of calibration, ranging, and trim factors in accordance with the following formula:

$$DTON = CT4 + \{[(RTDLIN - RZERO)/2]/R\text{-}SPAN\}TONSP \qquad (17)$$

wherein DTON is a desired on-time value, CT4 is a joint trimming and calibration adjustment factor for a 4 mA current loop, RTDLIN is the linearized RTD value, RZERO is a selected zero range table value, RSPAN is a selected full-to-zero range table value, and TONSP is a joint trimming and calibration adjustment factor for the on-time span calibration. The resulting desired on-time value DTON is clamped to a 15% minimum and 90% maximum duty cycle.

Every 16 ms the desired duty cycle DTON is filtered using a predefined filter constant to create an on-time and off-time ratio count per cycle. The duty cycle is controlled via the microcontroller's output hardware. The hardware is alternatively set for on-time and off-time. At the completion of each on or off cycle, the hardware issues an interrupt and switches the output to the opposite state. The system clock value at the interrupt is added to the on-time or off-time value to be stored in the output compare register to time the next output pulse.

The output compare interrupt routine is shown in FIG. 13 at step I12. When the output compare interrupt occurs, the pulse-width modulation signal is output to the current modulator 17 after output filtering is performed. Output filtering performs a calculation on the transition from the on-time to the off-time. The output filtering formula is:

$$TON = DTON + FC^*(\text{previous } TON - DTON) \qquad (18)$$

where TON is the next time-out value, FC is the output filter constant, and DTON is the desired TON. The off-time TOFF is then calculated as 4096-TON. The preferred embodiment of a 4-20 mA transmitter would have duty cycle and TON values in accordance with Table 2:

TABLE 2

| Percentage On | Current | TON |
|---|---|---|
| 100.0% | 24.0 mA | 4096 |
| 990.0% | 21.6 mA | 3686 |
| 83.3% | 20.0 mA | 3413 |
| 16.7% | 4.0 mA | 682 |
| 15.0% | 3.6 mA | 614 |

In step S24 of FIG. 12, the results of these calculations is displayed to the user via the display 36. Every 400 ms, the display is updated to the present (signed) temperature reading in either degrees C or F, or a resistance reading in ohms, or a differential resistance reading in ohms, depending upon the system configuration determined by the jumpers 40. The linearized RTD values must be display-filtered using a display filter constant, and then scaled for the type and configuration of output. For example, the display temperature may be calculated according to the formula:

$$DSPTMP = [(DSLIN^*TPSLP) - TPOFF]/16 \qquad (19)$$

wherein DSTMP is the display temperature, DSLIN is the display-filtered linearized RTD resistance value, TPSLP is the temperature conversion slope, TPOFF is the temperature conversion offset, and the value 16 is for internal math unit conversion. Of course, if a fault has occurred, the display update is not performed and an error code or message is displayed.

In step S26, the switch information from the user-accessible switches 38 is processed. In the preferred embodiment, four panel buttons are monitored every 200 ms, and their functions are dependent upon the particular jumper configuration. For example, the switches may be configured as momentary 0-up, 0-down, span-up, and span-down adjustments. Numerous other user-adjustable parameters may also be included.

In step S28, the system configuration is processed by reading information from the jumpers 40. Minor jumper settings, e.g., degrees C or F or ohms, etc., are checked every 200 ms, and the system is adjusted to respond to any changes. Major jumper changes, e.g., the type of sensor configuration, the functions of the switches, etc., are checked only when a switch is depressed. As shown in step I14 of FIG. 13, a reset interrupt, either from a manual reset or from a power-up, causes a re-initialization of the microcontroller such that all of the jumpers are again checked.

Finally, step I16 of FIG. 13 illustrates that the factory test interrupt will cause the microcontroller to directly communicate with an external personal computer (PC). When a PC is connected to the microcontroller 22 via the communication port 41 of FIG. 1, communication messages may be received as character interrupts. A number of different automated factory test and calibration operations may be performed when the microcontroller 22 communicates with the external PC.

While specific embodiments of the present invention have been shown and described herein, further modifications and improvements may be made by those skilled in the art. For example, various other multiplexing and/or converting schemes may be used to provide the same input terminal information to the microcontroller. Moreover, the particular three-and four-wire RTD configurations disclosed above could readily be modified to fit various other condition-measuring applications. Further modifications and improvements may be made by those skilled in the art. All such modifications which retain the basic underlying principles disclosed and claimed herein are within the scope of this invention.

What is claimed is:

1. A control circuit for a remote two-wire transmitter connected to at least one resistance temperature device (RTD), said RTD having at least three sensor wires connected to said transmitter, said control circuit comprising:

a four-channel analog multiplexer having at least three of its input terminals connected to said RTD sensor wires, having at least two address lines, and having at least one output port;

current source means for applying current to said sensor through two of said three sensor wires;

a switched impedance circuit, comprising at least a resistor and a switching device, for connecting a known impedance to said output port in response to a test signal;

a flip-flop connected to at least two of said address lines for providing said test signal;

one of said address lines is connected to a clock input port of said flip-flop, and another of said address lines is connected to a data input port of said flip-flop, wherein the phase relationship between said first and second address lines determines whether said known impedance is connected to said output port; and means for controlling said address lines to operate said multiplexer and said flip-flop in a measurement mode, wherein said known impedance is not connected to said output port, and in a test mode, wherein said known impedance is connected to said output port, and for determining whether a faulty connection exists between said multiplexer and said RTD.

* * * * *